US006795355B2

(12) United States Patent
Ooishi

(10) Patent No.: US 6,795,355 B2
(45) Date of Patent: Sep. 21, 2004

(54) SEMICONDUCTOR INTEGRATED CIRCUIT DEVICE WITH INTERNAL POTENTIAL GENERATING CIRCUIT ALLOWING EXTERNAL TUNING OF INTERNAL POWER SUPPLY POTENTIAL

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 26 days.

(21) Appl. No.: 10/200,257

(22) Filed: Jul. 23, 2002

(65) Prior Publication Data

US 2003/0112676 A1 Jun. 19, 2003

(30) Foreign Application Priority Data

Dec. 19, 2001 (JP) ..................................... 2001-386311

(51) Int. Cl.[7] ............................................... G11C 7/00
(52) U.S. Cl. ..................... 365/201; 365/158; 365/210; 365/189.05; 365/189.07; 365/191; 365/226; 365/189.09
(58) Field of Search ............................... 365/201, 158, 365/210, 189.05, 189.07, 191, 226, 189.09

(56) References Cited

U.S. PATENT DOCUMENTS

| | | | |
|---|---|---|---|
| 6,072,718 A | 6/2000 | Abraham et al. | |
| 6,081,445 A | 6/2000 | Shi et al. | |
| 6,175,525 B1 * | 1/2001 | Fulkerson et al. | 365/189.05 |
| 6,184,720 B1 | 2/2001 | Kim et al. | |
| 6,304,477 B1 | 10/2001 | Naji | |
| 6,324,103 B2 | 11/2001 | Hiraki et al. | |
| 6,493,258 B1 * | 12/2002 | Lu et al. | 365/158 |
| 6,597,601 B2 * | 7/2003 | Ooishi | 365/171 |

FOREIGN PATENT DOCUMENTS

| | | |
|---|---|---|
| DE | 199 12 446 C1 | 3/1999 |
| DE | 199 60 244 C1 | 12/1999 |
| DE | 199 56 550 A1 | 6/2000 |
| DE | 100 22 767 A1 | 11/2001 |

OTHER PUBLICATIONS

Roy Scheuerlein, et al., "A 10ns Read and Write Non–Volatile Memory Array using a Magnetic Tunnel Junction and FET Switch in Each Cell", ISSCC Digest of Technical Papers, TA 7.2, 2000 IEEE International Solid–State Circuits Conference, Feb. 8, 2000, pp. 94–98, 128–129, 409–410.

M. Durlam, et al., "Nonvolatile RAM based on Magnetic Tunnel Junction Elements", ISSCC Digest of Technical Papers, TA7.3, 2000 IEEE International Solid–State Circuits Conference, Feb. 8, 2000, pp. 130–131.

* cited by examiner

*Primary Examiner*—Richard Elms
*Assistant Examiner*—Pho M. Luu
(74) *Attorney, Agent, or Firm*—McDermott, Will & Emery

(57) ABSTRACT

A semiconductor integrated circuit device includes a plurality of internal circuits, internal potential generating circuits for converting a level of an external power supply potential to supply an internal potential at a level corresponding to a level set signal, a control portion for successively applying the plurality of level set signals to each of the internal potential generating circuits, and a measuring circuit for comparing each internal potential with a reference potential, and holding information representing results of the comparison. During a test period, a comparing circuit in the internal potential generating circuit compares a level corresponding to the level set signal with a comparison reference potential.

19 Claims, 33 Drawing Sheets

FIG.6

| STEP | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| P0 | 0 | 1 | 0 | 1 | 0 | 1 | 0 | 1 | 0 | 1 | 0 | 1 | 0 | 1 | 0 | 1 |
| P1 | 0 | 0 | 1 | 1 | 0 | 0 | 1 | 1 | 0 | 0 | 1 | 1 | 0 | 0 | 1 | 1 |
| P2 | 0 | 0 | 0 | 0 | 1 | 1 | 1 | 1 | 0 | 0 | 0 | 0 | 1 | 1 | 1 | 1 |
| P3 | 1 | 1 | 1 | 1 | 1 | 1 | 1 | 1 | 0 | 0 | 0 | 0 | 0 | 0 | 0 | 0 |
| VRI' | −8 | −7 | −6 | −5 | −4 | −3 | −2 | −1 | 0 | +1 | +2 | +3 | +4 | +5 | +6 | +7 |
| φ310 | L | L | L | L | L | L | H | H | H | H | H | H | H | H | H | H |

SEMICONDUCTOR INTEGRATED CIRCUIT DEVICE WITH INTERNAL POTENTIAL GENERATING CIRCUIT ALLOWING EXTERNAL TUNING OF INTERNAL POWER SUPPLY POTENTIAL

BACKGROUND OF THE INVENTION

1. Field of the Invention

The present invention relates to a semiconductor integrated circuit device, and particularly to a semiconductor integrated circuit device provided with an internal potential generating circuit, which allows external tuning of an internal power supply potential.

2. Description of the Background Art

A conventional semiconductor integrated circuit device is provided with an internal power supply potential generating circuit for producing an internal power supply potential, which is lower or higher than an external power supply potential, and applying it to internal circuits. Since the output potential of the internal power supply potential generating circuit varies due to variations in manufacturing process and others, the device is generally configured to allow external tuning of the output potential of the internal power supply potential generating circuit.

In the prior art, however, the output potential of the internal power supply potential generating circuit is tuned while monitoring it by an external tester. Therefore, the tuning is not easy.

In recent years, a system LSI or the like may be provided with internal power supply potential generating circuits for supplying different internal power supply potentials to internal circuits having different functions, respectively. In this structure, it is necessary to tune the output potential levels of the plurality of internal power supply potential generating circuits while monitoring these output potential levels by a tester. This increases the difficulty in tuning.

Results of such tuning of the internal power supply generating circuit must be finally stored in a nonvolatile manner within the semiconductor integrated circuit device. Processing for such storage will be referred to as "programming processing" hereinafter.

Such programming is generally performed by blowing fuse elements in the prior art. However, for programming an output potential level of each of a plurality of internal power supply potential generating circuits, many fuse elements are required, which is disadvantageous from the viewpoint of a circuit area.

Accordingly, it is desired that the element for programming the output potential level allows nonvolatile programming of data.

Attention is being given to a MRAM (Magnetic Random Access Memory) device as a memory device, which can nonvolatilely store data with low power consumption. The MRAM device is a memory device, in which a plurality of thin film magnetic elements are formed in a semiconductor integrated circuit for nonvolatilely storing data, and random access to each thin film magnetic element is allowed.

Particularly, in recent years, it has been announced that a performance of the MRAM device can be dramatically improved by using the thin film magnetic elements, which utilize the MTJs (magnetic tunnel junctions), as memory cells. The MRAM device with memory cells having the magnetic tunnel junctions has been disclosed in technical references such as "A 10 ns Read and Write Non-Volatile Memory Array Using a Magnetic Tunnel Junction and FET Switch in each Cell", ISSCC Digest of Technical Papers, TA7.2, Feb. 8, 2000, and "Nonvolatile RAM based on Magnetic Tunnel Junction Elements", ISSCC Digest of Technical Papers, TA7.3, Feb. 8, 2000.

FIG. 32 conceptually shows a structure of a memory cell, which has a magnetic tunnel junction, and may be merely referred to as an "MTJ memory cell" hereinafter.

Referring to FIG. 32, a MTJ memory cell includes a tunneling magneto-resistance element TMR having an electric resistance, which is variable in accordance with a level of storage data, and an access transistor ATR for forming a path of a sense current Is passing through tunneling magneto-resistance element TMR in a data read operation. Access transistor ATR is formed of, e.g., a field-effect transistor, and is coupled between tunneling magneto-resistance element TMR and a fixed voltage (ground voltage Vss).

For the MTJ memory cell, the structure includes a write word line WWL for instructing data writing, a read word line RWL for executing data reading and a bit line BL, which is a data line for transmitting an electric signal in accordance with the data level of the storage data.

FIG. 33 conceptually shows an operation of reading data from the MTJ memory cell.

Referring to FIG. 33, tunneling magneto-resistance element TMR has a ferromagnetic layer, which has a uniform magnetization direction, and may be merely referred to as a "fixed magnetic layer" hereinafter, and a ferromagnetic layer VL, which is magnetized in a direction depending on an externally applied magnetic field, and may be merely referred to as a "free magnetic layer" hereinafter. A tunneling barrier TB formed of an insulator film is disposed between fixed magnetic layer FL and free magnetic layer VL. Free magnetic layer VL is magnetized in the same direction as fixed magnetic layer FL or in the different direction in accordance with the data level of the storage data.

In the data read operation, access transistor ATR is turned on in response to activation of read word line RWL. Thereby, sense current Is can flow through a current path formed of bit line BL, tunneling magneto-resistance element TMR, access transistor ATR and ground voltage Vss.

Tunneling magneto-resistance element TMR has an electric resistance, which is variable depending on a correlation in magnetization direction between fixed magnetic layer FL and free magnetic layer VL. More specifically, when the magnetization direction of fixed magnetic layer FL and the magnetization direction written in free magnetic layer VL are uniform (parallel) direction, the electric resistance of tunneling magneto-resistance element TMR is smaller than that in the case where these layers FL and VL are magnetized in the opposite directions, respectively.

As described above, the tunneling magneto-resistance element TMR has the electric resistance, which is variable depending on the magnetization direction. Therefore, data storing can be performed by determining a relationship between the two magnetization directions of free magnetic layer VL in tunneling magneto-resistance element TMR and the levels ("1" and "0") of the stored data.

Changes in voltage, which are caused in tunneling magneto-resistance element TMR by sense current Is, depend on the magnetization direction of the free magnetic layer, i.e., the storage data level. For example, if sense current Is is passed through tunneling magneto-resistance element TMR after precharging bit line BL to a predetermined voltage, the storage data of the MTJ memory cell can be read out by detecting the voltage on bit line BL.

FIG. 34 conceptually shows an operation of writing data in the MTJ memory cell.

Referring to FIG. 34, read word line RWL is inactive, and access transistor ATR is off in the data write operation. In this state, the data write currents for magnetizing free magnetic layer VL in the direction depending on the level of the write data are supplied to write word line WWL and bit line BL, respectively. The magnetization direction of free magnetic layer VL depends on the respective data write currents flowing through write word line WWL and bit line BL.

FIG. 35 conceptually shows a relationship between the direction of the data write current and the magnetization direction in the data write operation.

Referring to FIG. 35, an abscissa Hx gives a direction of a data write magnetic field H (BL) produced by the data write current flowing through bit line BL. An ordinate Hy indicates a direction of a data write magnetic field H(WWL) produced by the data write current flowing through write word line WWL.

The magnetization direction of free magnetic layer VL can be rewritten only when a sum of applied magnetic fields H(BL) and H(WWL) falls within a region outside an asteroid characteristic line shown in FIG. 35.

Therefore, the magnetization direction of free magnetic layer VL does not change when the data write magnetic fields applied thereto have intensities corresponding to a region inside the asteroid characteristic line. For updating the storage data of the MTJ memory cell, currents at a predetermined level or higher must be passed through both write word line WWL and bit line BL, respectively. The magnetization direction, which was once written into tunneling magneto-resistance element TMR, and thus the storage data of MTJ memory cell is held nonvolatilely until next data writing is executed.

In the data read operation, sense current Is flows through bit line BL. However, the sense current Is is generally determined to be smaller by one or two digits than the data write current already described. Therefore, such a possibility is small that sense current Is affects to rewrite erroneously the storage data of the MTJ memory cell in the data read operation.

The references described before have disclosed technologies for integrating such MTJ memory cells on a semiconductor substrate to provide a random access memory MRAM device.

However, a sufficient study has not been conducted on appropriate circuit structures for performing the foregoing "programming processing" with such "tunneling magneto-resistance element TMRs", and there is a problem that the circuit structure required for the "programming processing" is not sufficiently clarified.

SUMMARY OF THE INVENTION

An object of the invention is to provide a semiconductor integrated circuit device, which allows easy tuning of internal power supply potentials produced by a plurality of internal power supply generating circuits.

Another object of the invention is to provide a semiconductor integrated circuit device, which can electrically and nonvolatilely record results of tuning of internal power supply potentials produced by a plurality of internal power supply generating circuits.

In summary, the invention provides a semiconductor integrated circuit device including at least one internal circuit, an internal potential generating circuit, a test control circuit, a measuring circuit and a transmitting circuit.

The internal circuit performs predetermined processing based on at least data applied externally with respect to the semiconductor integrated circuit device or data transmitted mutually. The internal potential generating circuit is provided corresponding to the internal circuit for receiving a level set signal including information representing a level of an internal potential, and producing an internal potential at a level corresponding to the level set signal. The internal potential generating circuit includes a comparing circuit for comparing a comparison reference potential with a level corresponding to the level set signal in a test operation. The test control circuit controls test processing of a level of an output potential of the internal potential generating circuit, and operates in the test operation to apply successively the plurality of level set signals to the internal potential generating circuit. The measuring circuit performs measurement in the test operation for detecting a set value required in the level set signal based on results of the comparison by the comparing circuit between the levels corresponding to the plurality of level set signals and the comparison reference potential. The transmitting circuit transmits results of the measurement of the measuring circuit to the test control circuit.

According to another aspect of the invention the semiconductor integrated circuit device includes a program circuit for holding information relating to the semiconductor intergrated circuit device. The program circuit includes a latch circuit for receiving a power supply potential via first and second power supply nodes. The latch circuit is activated in response to power-on of the latch circuit. The program circuit further includes first and second tunneling magneto-resistance elements arranged between the first and second power supply nodes and the latch circuit, respectively.

According to another aspect of the invention, a semiconductor integrated circuit device includes at least one internal circuit, an internal potential generating circuit, a test control circuit, a measuring circuit and a transmitting circuit.

The internal circuit performs predetermined processing based on at least data applied externally with respect to the semiconductor integrated circuit device or data transmitted mutually. The internal potential generating circuit is provided corresponding to the internal circuit for receiving a level set signal including information representing a level of an internal potential, and producing an internal potential at a level corresponding to the level set signal.

The internal potential generating circuit includes a comparing circuit and a potential control circuit. The comparing circuit operates in a normal operation to compare the internal potential generated by the internal potential generating circuit with the level corresponding to the level set signal, and operates in a test operation to stop the comparison between the level corresponding to the level set signal and the internal potential, and to compare a comparison reference potential with the level corresponding to the level set signal. The potential control circuit tunes the level of the internal potential in accordance with an output of the comparing circuit.

The test control circuit controls test processing of a level of the output potential of the internal potential generating circuit, and operates in the test operation to apply successively the plurality of level set signals to the internal potential generating circuit for successively generating the plurality of internal potentials at different levels, respectively. The measuring circuit performs measurement in the test operation for detecting a set value required in the level set signal based on results of the comparison by the comparing circuit between the respective internal potentials generated by the internal potential generating circuit and the comparison reference potential. The transmitting circuit transmits results of the measurement of the measuring circuit to the test control circuit.

Accordingly, the invention has the following advantage. In the structure having the internal potential generating circuits corresponding to the internal circuits, respectively, the level set signal for producing the internal potential corresponding to the reference potential can be easily detected based on the output signal of the measuring circuit. Therefore, the internal potential can be easily tuned based on results of the detection. Further, it is possible to reduce a time required for detecting processing of this level set signal.

Further, the invention has such an advantage that the value of the detected level set signal can be programmed with a magneto-resistance element.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 shows, by way of example, signals P0–P3 representing tuning information and a relative value VRI' of an internal reference potential VRI and an output signal of comparing circuit 310;

FIG. 16 conceptually shows an operation during programming in a programming element PGE and after power-on;

FIG. 17 conceptually shows a state of programming element PGE before a signal POR1 rises after the power-on;

FIG. 23 conceptually shows a state of programming element PGE' shown in FIG. 21 immediately after the power-on;

FIG. 24 shows a state, in which power-on reset signal POR1 attains "H" level in programming element PGE' after the power-on;

DESCRIPTION OF THE PREFERRED EMBODIMENTS

Embodiments of the invention will now be described with reference to the drawings.

Figure 1:
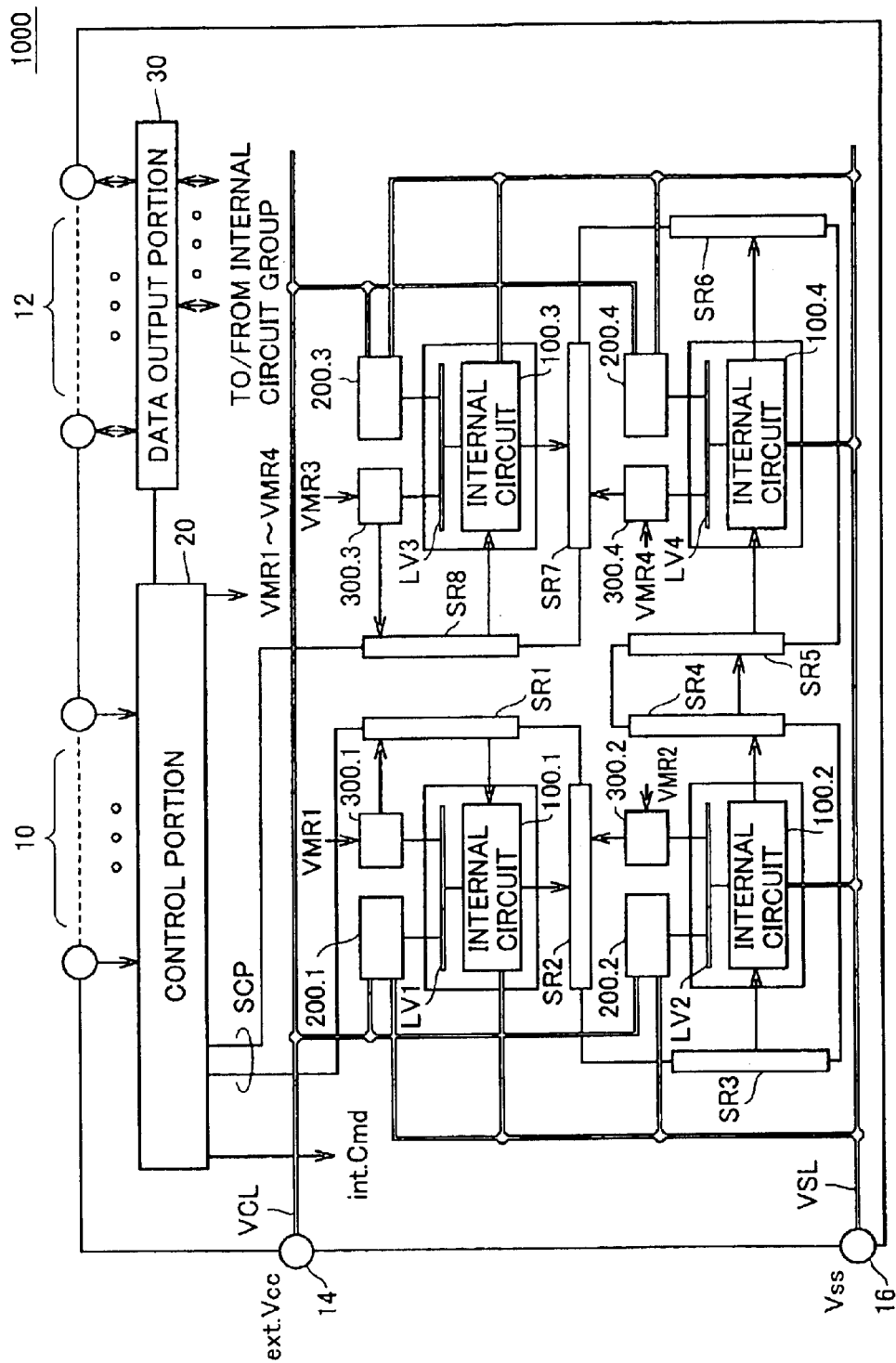
FIG. 1 is a schematic block diagram showing a circuit structure of a semiconductor integrated circuit device 1000 of a first embodiment of the invention.

FIG. 1 is a schematic block diagram showing a circuit structure of a semiconductor integrated circuit device 1000 of a first embodiment of the invention.

Referring to FIG. 1, semiconductor integrated circuit device 1000 includes a control signal input terminal group 10 for externally receiving control signals, a data I/O terminal group 12 for externally sending and receiving data, a power supply terminal 14 for externally receiving an external power supply potential ext.Vcc, a ground terminal 16 for externally receiving ground voltage Vss, a control portion 20 for controlling an operation of semiconductor integrated circuit device 1000 based on a signal sent from external control signal input terminal group 10, a data I/O portion 30 for externally sending and receiving data via data I/O terminal group 12, internal circuits 100.1–100.4, which are controlled by control portion 20 to perform data transmission to and from data I/O portion 30 as well as data transmission to and from each other, and to perform predetermined data processing, a power supply interconnection VCL for transmitting an external power supply potential ext.Vcc from power supply terminal 14 to internal circuits 100.1–100.4, and a ground interconnection VSL for transmitting ground voltage Vss from ground terminal 16 to internal circuits 100.1–100.4. Although FIG. 1 shows the four internal circuits for the sake of illustration, the internal circuits may be more or fewer than four in number.

Semiconductor integrated circuit device 1000 further includes internal power supply potential generating circuits 200.1–200.4, which are arranged between internal circuits 100.1–100.4 and power supply interconnection VCL for raising or lowering external power supply potential ext.Vcc to supply the raised or lowered voltages to corresponding internal circuits 100.1–100.4, respectively, internal power supply interconnections LV1–LV4 for transmitting the internal power supply potentials supplied from internal power supply potential generating circuits 200.1–200.4 to internal circuits 100.1–100.4, respectively, and measuring circuits 300.1–300.4, which are provided corresponding to internal circuits 100.1–100.4 for receiving measurement reference potentials VMR1–VMR4 supplied from control portion 20, measuring the potential levels of internal power supply interconnections LV1–LV4 in the corresponding internal circuits and outputting results of the measurement, respectively. Each of the potential levels produced by internal power supply potential generating circuits 200.1–200.4 may be different from the others, or may be equal to one, some or all of the others.

Control portion 20 issues an internal control signal int.Cmd to internal circuits 100.1–100.4 for controlling the operations of internal circuits 100.1–100.4, respectively.

Semiconductor integrated circuit device 1000 further has a scan path SCP for successively and serially transmitting test signals, which are to be applied to internal circuits 100.1–100.4, respectively, from control portion 20, receiving signals produced as a result of the test operations from internal circuits 100.1–100.4 as well as data to be transmitted mutually between internal circuits 100.1–100.4, and serially transmitting the received signals and data to control portion 20. Scan path SCP is provided with shift registers SR1–SR8 for transmitting the data to be applied to internal circuits 100.1–100.4, receiving the data output from internal circuits 100.1–100.4, and serially transmitting the received data.

Figure 2:
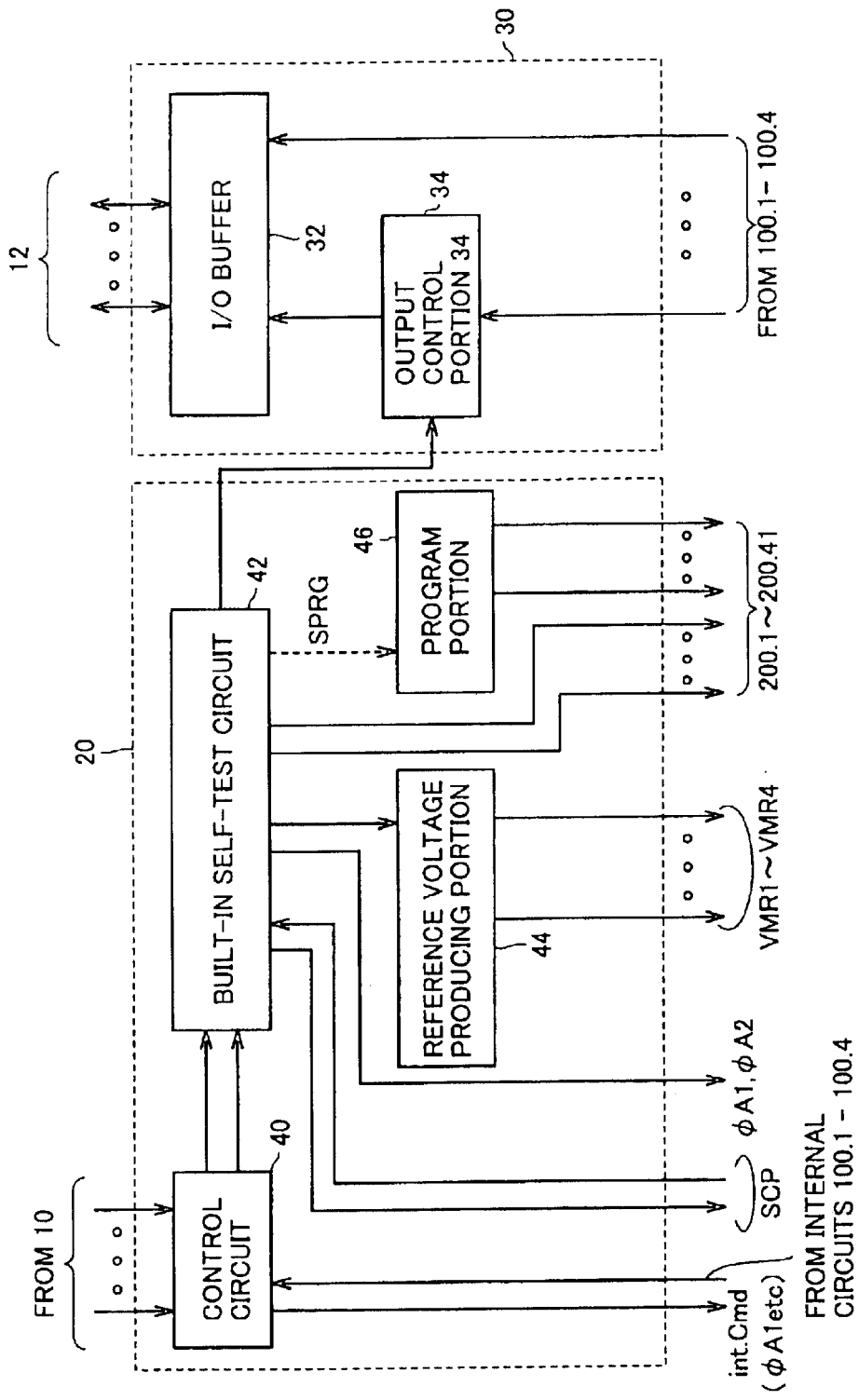
FIG. 2 is a schematic block diagram fragmentarily showing structures of a control portion 20 and a data I/O portion 30 shown in FIG. 1.

FIG. 2 is a schematic block diagram fragmentarily showing structures of control portion 20 and data I/O portion 30 shown in FIG. 1.

Control portion 20 includes a control circuit 40 for operating in accordance with signals, which are applied from control signal input terminal group 10, to output signals for controlling the operations of internal circuits 100.1–100.4 in a normal operation, and to output signals for controlling start and end of a built-in self-test in a test operation, a built-in self-test circuit 42 which starts the built-in self-test in accordance with a signal sent from control circuit 40, transmits data via scan path SCP to and from internal circuits 100.1–100.4, and thereby performing the built-in self-test, a reference voltage producing portion 44 for producing reference voltages VMR1–VMR4 to be applied to measuring circuits 300.1–300.4 under the control of built-in self-test circuit 42, and a program portion 46, which nonvolatilely stores information for tuning the internal power supply potentials produced by internal power supply potential generating circuits 200.1–200.4, and applies program data corresponding to the tuning information to corresponding internal power supply potential generating circuits 200.1–200.4.

During the built-in self-test period, as will be described later, a built-in self-test circuit output signal, which is applied from built-in self-test circuit 42, and will be referred to as a "BIST circuit output signal" hereinafter, controls output potentials of internal power supply potential generating circuits 200.1–200.4 instead of a program portion output signal applied from program portion 46.

The program portion 46 is provided with fuse elements or the like for nonvolatilely storing information for tuning, e.g., by external laser irradiation. Alternatively, program portion 46 may be provided with a nonvolatile storage element for nonvolatilely storing information for tuning by an electric signal SPRG so that the tuning information can be stored in accordance with instructions from built-in self-test circuit 42.

When measuring circuits 300.1–300.4 finish the operations of measuring the operation voltages of internal power supply potential generating circuits 200.1–200.4, built-in self-test circuit 42 receives the data of results of the measurement from measuring circuits 300.1–300.4 via scan path SCP. Thereafter, an output control circuit 34 in data I/O portion 30 externally outputs the data of measurement results received by built-in self-test circuit 42 via an I/O buffer 32 in accordance with an instruction applied from built-in self-test circuit 42.

In the normal operation, I/O buffer 32 externally outputs the data applied from internal circuits 100.1–100.4 via data I/O terminal group 12, and outputs the externally applied data to internal circuits 100.1–100.4 via data I/O terminal group 12.

Figure 3:
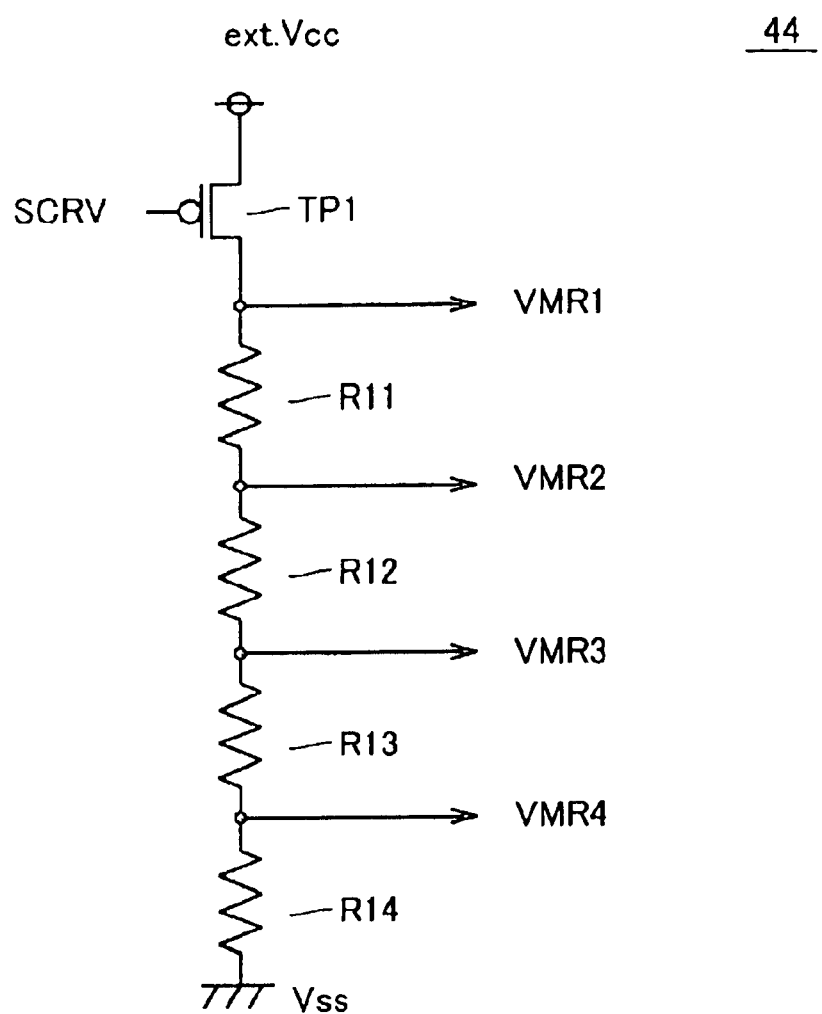
FIG. 3 is a circuit diagram showing a structure of a reference voltage producing portion 44 shown in FIG. 2.

FIG. 3 is a circuit diagram showing a structure of reference voltage producing portion 44 shown in FIG. 2.

Reference voltage producing portion 44 includes a P-channel MOS transistor TP1 and resistors R11–R14, which are connected in series between power supply potential Vcc and ground potential Vss. Transistor TP1 receives on its gate a control signal SCRV from built-in self-test circuit 42, and is on during a period of the built-in self-test.

Reference voltage VMR1 is output from a connection node between transistor TP1 and resistor R11, and reference voltage VMR2 is output from a connection node between resistors R11 and R12. Also, reference voltage VMR3 is output from a connection node between resistors R12 and R13, and reference voltage VMR4 is output from a connection node between resistors R13 and R14.

The resistance values of resistors R11–R14 and resistance ratios between them are predetermined. Therefore, the voltage levels of reference voltages VMR1–VMR4 take predetermined values, respectively.

Figure 4:
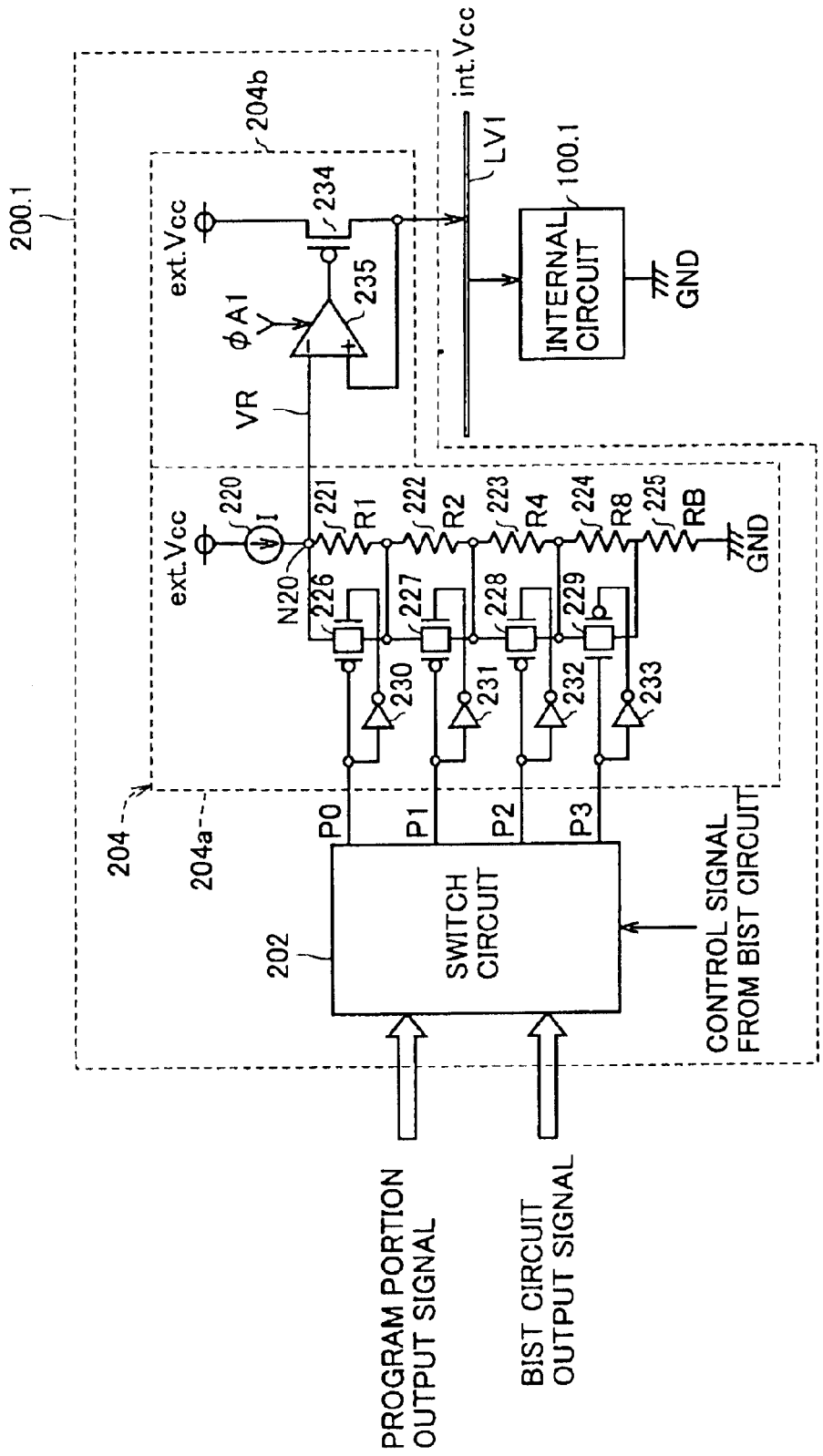
FIG. 4 is a schematic block diagram showing a structure of an internal power supply potential generating circuit 200.1 shown in FIG. 1.

FIG. 4 is a schematic block diagram showing a structure of internal power supply potential generating circuit 200.1 shown in FIG. 1.

Other internal power supply potential generating circuits 200.2–200.4 have basically the same structure as internal power supply potential generating circuit 200.1.

Referring to FIG. 4, internal power supply potential generating circuit 200.1 includes a switch circuit 202, which receives a program portion output signal sent from program portion 46 and a BIST circuit output signal sent from built-in self-test circuit (which will be merely referred to "BIST circuit" hereinafter) 42, and selectively outputs the received signals as signals P0–P3 representing the tuning information in accordance with the control signal sent from BIST circuit 42, a reference potential generating circuit 204a for receiving the output of switch circuit 202 and generating the reference potential based on the received output, and a driver circuit 204b for driving the potential level of internal power supply line LV1 in accordance with output voltage VRI of reference potential generating circuit 204a.

Reference potential generating circuit 204a includes a constant current supply 220 and a tuning resistance portion TRP. Tuning resistance portion TRP includes resistance elements 221–225, transfer gates 226–229 and inverters 230–233.

Constant current supply 220 is connected between supply interconnection VCL of external power supply potential ext.Vcc and an output node N20, and applies a predetermined constant current I to node N20.

Resistance elements 221–225 are connected in series between output node N20 and supply interconnection VSL of ground potential Vss. Resistance elements 221–225 have predetermined resistance values R1, R2, R4, R8 and RB satisfying a relationship of (R1:R2:R4:R8=1:2:4:8), respectively.

Resistance elements 221–224 are connected in parallel to transfer gates 226–229, respectively. Signals P0–P2 applied from BIST circuit 42 or program portion 46 are directly applied to gates of P-channel MOS transistors of transfer gates 226–228, respectively, and are also applied via inverters 230–232 to gates of N-channel MOS transistors of transfer gates 226–228, respectively. Signal P3 sent from BIST circuit 42 or program portion 46 is directly applied to a gate of an N-channel MOS transistor of transfer gate 229, and is applied to a gate of a P-channel MOS transistor of transfer gate 229 via an inverter 233.

A resistance value R between output node N20 and supply interconnection VSL of ground potential Vss is variable in sixteen steps in accordance with combinations of logical levels of signals P0–P3. For example, when all signals P0–P3 are at "L" level, transfer gates 226–228 are turned on, and transfer gate 229 is turned off so that resistance value R is equal to (R8+RB). This resistance value of (R8+RB) is equal to a designed value, and thus is predetermined. Potential VRI on output nod N20 is equal to (R×I).

Driver circuit 204b includes a P-channel MOS transistor 234 and a differential amplifier 235. P-channel MOS transistor 234 is connected between supply interconnection VSL of external power supply potential ext.Vcc and supply line LV1 of an internal power supply potential int.Vcc. Differential amplifier 235 is controlled by a signal φA1, which is applied from control circuit 40 in control portion 20 during the normal operation, and is applied from built-in self-test circuit 42 in control portion 20 during the test operation. Differential amplifier 25 receives an output potential VRI of reference potential generating circuit 204a on its inverted input node, has a non-inverted input node connected to supply interconnection LVI of internal power supply potential int.Vcc, and supplies its output signal to a gate of P-channel MOS transistor 234.

When signal φA1 is inactive and thus at "L" level, the output signal of differential amplifier 235 is fixed to "H" level, and P-channel MOS transistor 234 is turned off.

When signal φA1 is active and at "H" level, differential amplifier 235 controls the gate potential of P-channel MOS transistor 234 so that internal power supply potential int.Vcc may be equal to reference potential VRI. Therefore, internal power supply potential int.Vcc is equal in level to reference potential VRI.

In FIG. 4, therefore, internal circuit 100.1 is driven by internal power supply potential int.Vcc prepared by lowering external power supply potential ext.Vcc and ground potential Vss.

Figure 5:
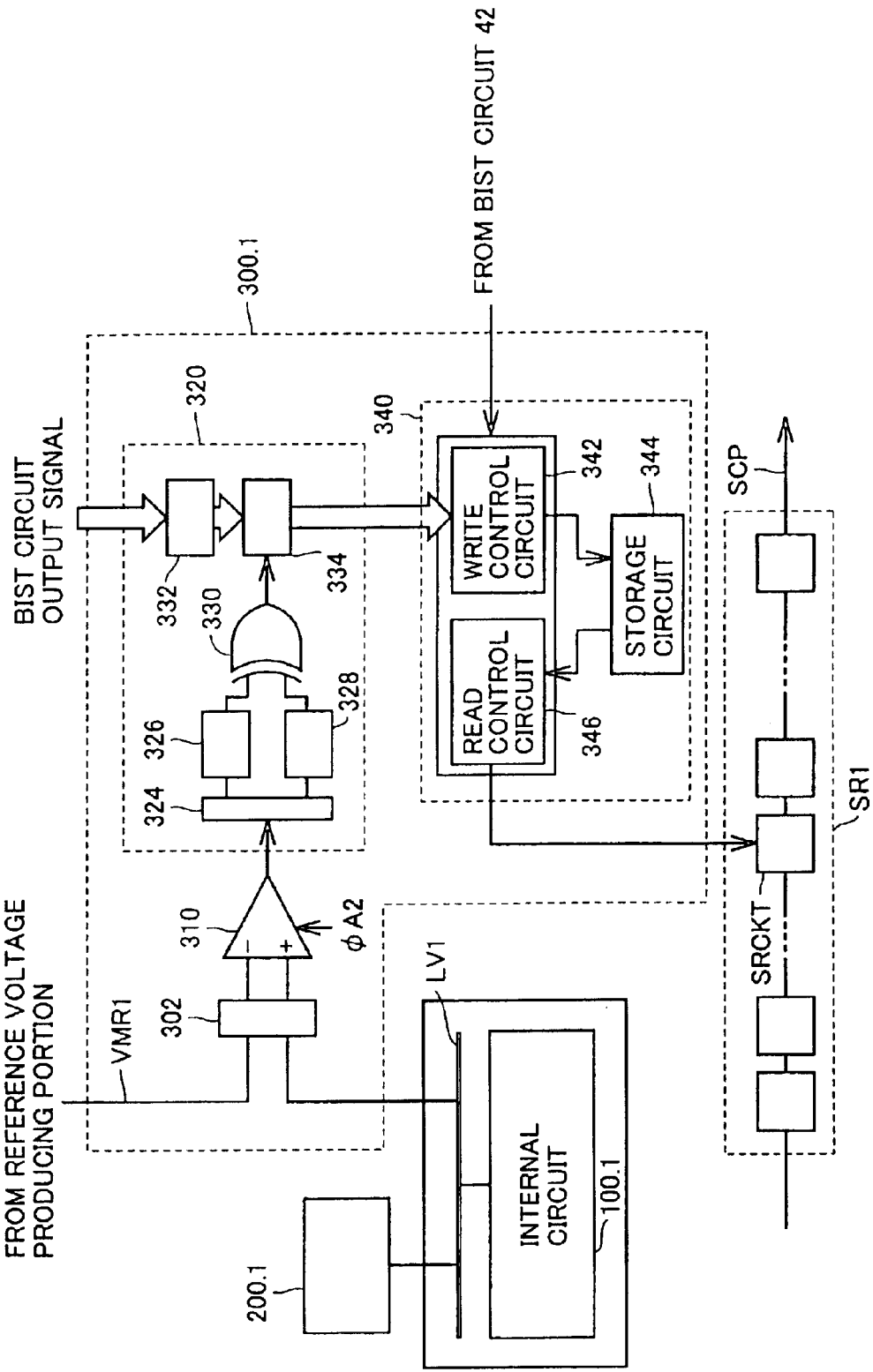
FIG. 5 is a schematic block diagram showing a structure of a measuring circuit 300.1 shown in FIG. 1.

FIG. 5 is a schematic block diagram for showing a structure of measuring circuit 300.1 shown in FIG. 1.

Other measuring circuits 300.2–300.4 have basically the same structure as measuring circuit 300.1.

Measuring circuit 300.1 includes a switch circuit 302, which receives the potential level of internal power supply line LV1 of corresponding internal circuit 100.1 and measurement reference potential VMR1 applied from reference voltage producing portion 44, and passes these potential levels under the control of BIST circuit 42, and a comparator 310, which is activated by a signal φA2 sent from built-in self-test circuit 42 to make a comparison between the level of potential on internal power supply line LV1 applied from switch circuit 302 and measurement reference potential VMR1.

In the test operation, as will be described later, BIST circuit 42 changes stepwise the level of the BIST circuit output signal to be applied to internal power supply potential generating circuit 200.1. Measuring circuit 300.1 receives the BIST circuit output signal from built-in self-test circuit 42. Measuring circuit 300.1 further includes a determining circuit 320 for operating in the test operation based on the output of comparator 310 to detect the time when the BIST circuit output signal attains the predetermined level, and the potential level of internal power supply line LV1 matches with the measurement reference potential VMR1 produced by reference voltage producing portion 44, and thereby selectively outputting the BIST circuit output signal.

Determining circuit 320 includes an interleave circuit 324, latch circuits 326 and 328, EXCLUSIVE-OR gate circuit 330, a latch circuit 332 and a gate circuit 334.

Interleave circuit 324 first applies a "L" level to latch circuit 326, and then applies the output level of comparing circuit 310 alternately to latch circuits 328 and 326. Finally, interleave circuit 324 latches the signal level applied from interleave circuit 324, and applies the same to EXCLUSIVE-OR gate circuit 330.

EXCLUSIVE-OR gate circuit 330 outputs a signal at "L" level when the output levels of latch circuits 326 and 328 match with each other, and otherwise outputs a signal at "H" level.

For example, when the level of the BIST circuit output signal changes in multiple steps, and the output signal of comparator 310 changes from "L" level to "H" level in a certain step, the output level of EXCLUSIVE-OR gate circuit 330 attains "H" level. In the other steps, the output of EXCLUSIVE-OR gate circuit 330 is at "L" level.

In each of the steps where the BIST circuit output signal changes, latch circuit 332 holds its level, and gate circuit 334 outputs BIST circuit output signals PT0–PT3 in response to a rising edge of the output signal of EXCLUSIVE-OR gate 330.

The BIST circuit output signal applied from determining circuit 320 is applied to write control circuit 342 in memory circuit 340. Write control circuit 342 is controlled by BIST circuit 42 to write the BIST circuit output signal applied from determining circuit 320 to a storage circuit 344.

After the measuring operation ends, BIST circuit 42 controls read control circuit 346 to read out the BIST circuit output signal stored in storage circuit 344 therefrom, and stores it in a register SRCKT in shift register circuit SR1 on scan path SCP.

The self-test operation described above can be summarized as follows.

In the normal operation, the program output signal applied from program portion 46 is used for changing the level of reference voltage VRI, which is used for producing internal power supply potential int.Vcc output from internal power supply potential generating circuit 200.1. During the self-test period, however, the BIST circuit output signal applied from BIST circuit 42 is used instead of the foregoing program output signal for changing the level of reference voltage VRI.

Thereby, BIST circuit 42 performs the control to change reference potential level VRI and thereby to change the level of internal power supply potential int.Vcc during the self-test period. Other internal power supply potential generating circuits 200.2–200.4 operate similarly.

Internal power supply potential int.Vcc changed by BIST circuit 42 is compared with reference potentials VMR1–VMR4 applied from reference voltage producing portion 44. Based on the results of this comparison, write control circuit 342 accumulates the BIST circuit output signal, which is output when internal power supply potential int.Vcc attains the level corresponding to the reference potential, in storage circuit 344 on the chip.

In this manner, the measurement is repeated, and the BIST circuit output signal, which is accumulated in storage circuit 344 in accordance with the determination, is serially transmitted through scan path SCP under the control of built-in self-test circuit 42, and is taken into built-in self-test circuit 42.

FIG. 6 shows, by way of example, signals P0–P3 representing the tuning information supplied from program portion 46 or BIST circuit 42, a relative value VRI' of internal reference potential VRI and an output signal ϕ310 of comparing circuit 310.

In FIG. 6, this tuning mode is conducted in sixteen steps. Signals P3–P0 successively change to 1000, 1001 . . . 1111, 0000, 0001 . . . and 0111 in sixteen steps.

Assuming that internal reference potential VRI is equal to 0 when signals P3–P0 are equal to "0000", relative value VRI' of internal reference potential VRI successively changes to −8, −7, . . . , −1, 0, 1, . . . ,+7 in sixteen steps.

Output signal ϕ310 of comparator 310 is at "L" level in steps 1–6, and is at "H" level in steps 7–16. This means that internal power supply potential int.Vcc is lower than external reference potential VR in steps 1–6, and is higher than external reference potential VR in steps 7–16.

Figure 7:
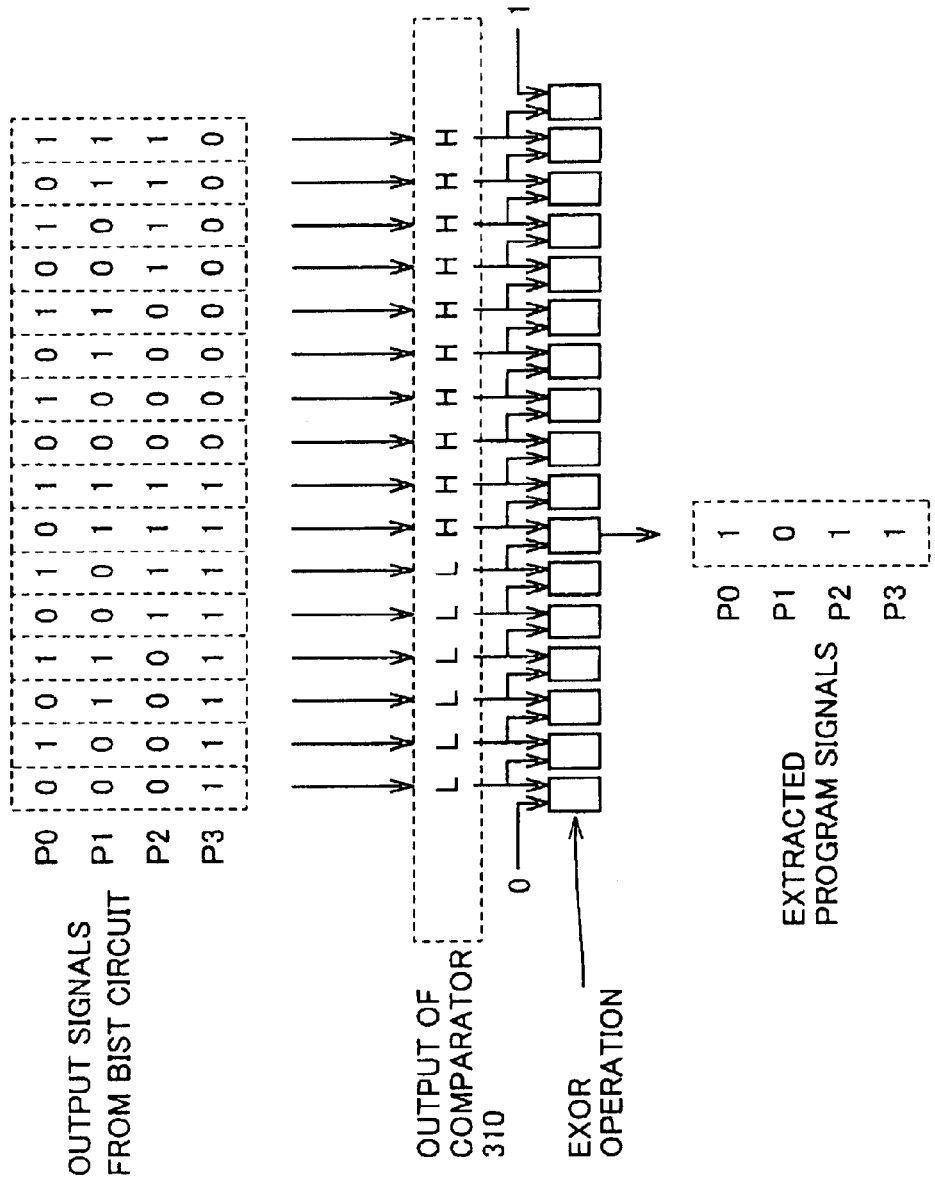
FIG. 7 conceptually shows processing performed by a determining circuit 320 when signals P0–P3 change as shown in FIG. 6.

FIG. 7 conceptually shows processing of determining circuit 320 in the case where signals P0–P3 change as shown in FIG. 6.

Referring to FIG. 7, gate circuit 334 applies signals P0–P3 to memory circuit 340 in response to the rising edge of output signal ϕ330 of EXCLUSIVE-OR gate 330 in determining circuit 320.

In the case shown in FIG. 6, signals (P3, P2, P1, P0) equal to (1101) in step 6 are applied to memory circuit 340.

Memory circuit 340 stores signals P0–P3 equal to "1101" applied from gate circuit 334, signals P3–P0 equal to "1101" are read out in accordance with the control signal applied from BIST circuit 42, and are successively output to scan path SCP one by one.

Figure 8:
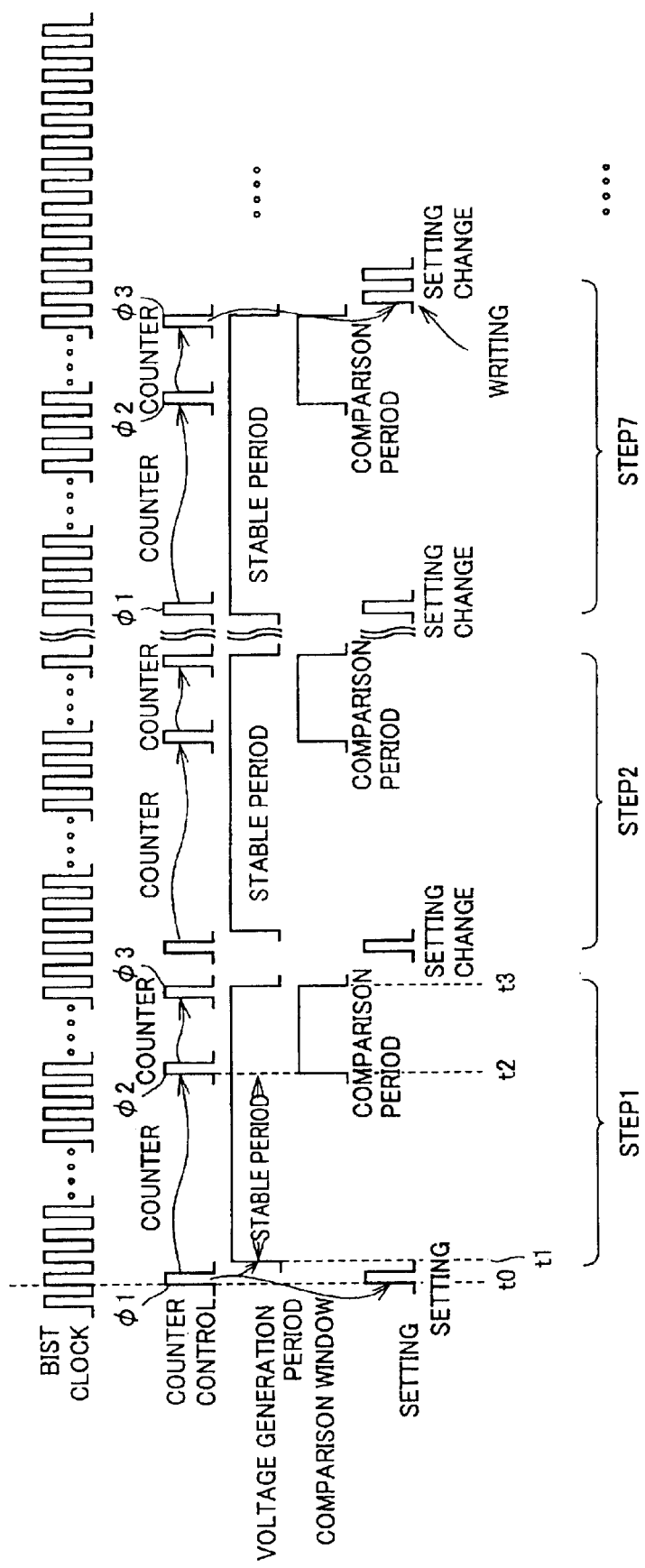
FIG. 8 is a timing chart representing an operation of a self-test of semiconductor integrated circuit device 1000.

FIG. 8 is a timing chart showing an operation of the self-test of semiconductor integrated circuit device 1000.

In FIG. 8, when entry in built-in self-test is set by the external control signal at a certain time t0, a pulse generating circuit (not shown) in built-in self-test circuit 42 raises a signal ϕ1 for the counter control to "H" level in a pulse-like form.

When signal ϕ1 rises to "H" level, BIST circuit output signals P3-P1 are set to an initial value, e.g., of "1000", and signal ϕA1 supplied from BIST circuit 42 rises to "H" level so that differential amplifier 235 becomes active, and the gate potential of P-channel MOS transistor 234 is controlled to provide internal power supply potential int.Vcc matching with internal reference potential VRI. In the built-in self-test, the signals supplied from BIST circuit 42 are applied as signals P0–P3 to internal power supply potential generating circuit 204 via switch circuit 202. In internal power supply potential generating circuit 204 shown in FIG. 4, all transfer gates 226–229 are turned on in response to signals P3–P0 equal to "1000", and internal reference potential VRI attains the lowest level (I×RB).

When signal ϕ1 is raised to "H" level, a counter (not shown) in BIST circuit 42 starts counting, and signal ϕ2 is raised to "H" level in a pulse-like form at a time t2 after a predetermined time from time t0. During this period between times t0 and t2, internal power supply potential int.Vcc is stabilized.

When signal ϕ2 rises to "H" level, signal ϕA2 is raised to "H" level, and comparing circuit 310 in FIG. 5 is activated. Comparing circuit 310 compares reference potential VMR1 with internal power supply potential int.Vcc, and outputs a signal at a level corresponding to results of the comparison to interleave circuit 324.

When signal ϕ2 rises to "H" level, the counter (not shown) in BIST circuit 42 restarts the counting to raise a signal ϕ3 to "H" level in a pulse like manner when a predetermined time elapses from time t2. Signal ϕ3 falls at a time t3. A comparison between reference potential VMR1 and internal power supply potential int.Vcc is made during a period between times t2 and t3.

In response to the falling edge of signal ϕ3, signals ϕA1 and ϕA2 attain "L" level. Thereby, differential amplifier 235 and comparing circuit 310 are deactivated.

For example, when the signals change as shown in FIG. 6, the output of EXCLUSIVE-OR gate 330 is not activated in step 1 corresponding to signals P3–P0 equal to "1000" so that data is not written into storage circuit 344 via gate circuit 334 and write control circuit 342.

Since the output of EXCLUSIVE-OR gate 330 is not activated even in steps 2–6, data is not written into storage circuit 344 via gate circuit 334 and write control circuit 342.

In step 7, the data representing comparison results of comparing circuit 310 passes through interleave circuit 324 in response to the falling edge of signal ϕ3, whereby the output of EXCLUSIVE-OR gate 330 becomes active. In response to this, storage circuit 344 is supplied with the BIST circuit output signal via gate circuit 334 and write control circuit 342.

Thereafter, the test is continued also in other internal power supply potential generating circuits 200.2–200.4, which are being tested in parallel, until the end of step 16 for detecting by EXCLUSIVE-OR gate 330 the fact that the data stored in latch circuits 326 and 328 are different from each other. The above test operation can be always continued until the end of the last step (i.e., step 16). Alternatively, the self-test may be ended when the outputs of EXCLUSIVE-OR gates 330 are activated in all internal power supply potential generating circuits 200.2–200.4.

According to the structure of semiconductor integrated circuit device 1000 described above, the value of signals P0–P3 for providing internal power supply potential int.Vcc, which is substantially equal to reference potential VMR1 or the like, is internally obtained by semiconductor integrated circuit device 1000 for each of internal power supply potential generating circuits 200.1–200.4, and is externally output. In the built-in self-test, the optimum value of signals P0–P3 can be easily obtained, and internal power supply potential int.Vcc can be easily tuned.

After the end of the above built-in self-test, processing of blowing off fuses in program portion 46 or processing of writing data into the nonvolatile storage element is performed so that output signals PG0–PG3 of program portion 46 take the optimum value of signals P0–P3 obtained in the built-in self-test, as described before.

In the normal operation, output signals GP0–P3 of program portion 46 are applied to internal power supply potential generating circuit 204 via switch circuit 202. For example, internal power supply potential generating circuit 204 corresponding to internal circuit 100.1 outputs internal power supply potential int.Vcc at a level substantially equal to that of reference potential VMR1.

In this first embodiment, internal power supply potential int.Vcc is successively increased in the sixteen steps during the built-in self-test. However, the invention is not restricted to this, and internal power supply potential int.Vcc may be successively decreased. Also, internal power supply potential int.Vcc may be successively increased from the reference level (corresponding to VRI' equal to 0 in FIG. 6) to the highest level (corresponding to VRI' equal to +7), and then may be successively decreased from the reference level to the lowest level (corresponding to VRI' equal to −7).

In the structure already described, memory circuits 340 are arranged inside measuring circuits 300.1–300.4, respectively. However, if one (e.g., internal circuit 100.4) of internal circuits 100.1–100.4 is a memory circuit having a function of storing data, such internal circuit 100.4 may be used as memory circuit 340.

[Second Embodiment]

In the structure of the first embodiment already described, reference potential VR is set based on the signal sent from BIST circuit 42 when the built-in self-test is performed as already described with reference to FIG. 4. Further, based on reference potential VR thus set, comparator 310 compares the potential level supplied to internal circuit 100.1 from power supply interconnection LV1, as shown in FIG. 5, and the BIST circuit output signal is stored in storage circuit 344 in accordance with results of this comparison.

According to the above structure, however, the level of internal power supply potential int.Vcc, which is applied to internal circuit 100.1 from driver circuit 204b based on the output signal of BIST circuit 42, is applied to comparator 235 for negative feedback. The comparator 310 must compare internal power supply potential int.Vcc with potentials VMR1–VMR4 produced from reference voltage producing portion 44 after internal power supply potential int.Vcc attains a stable level owing to this negative feedback.

In the operation shown in FIG. 8, therefore, the above stable period must be relatively large for stabilizing the level of internal power supply potential int.Vcc.

However, it may be merely required, e.g., in the test operation to determine whether the value of reference voltage VR already described with reference to FIG. 4 matches with the reference potential supplied from reference voltage producing portion 44 or not.

In the above case, the foregoing method in the first embodiment, which employs the sufficiently long stabilization period, increases the test time as compared with an originally required time.

The second embodiment will be described in connection with a structure, which requires a shorter time for detecting the fact that the value of reference voltage VR tuned in accordance with the program matches with intended reference voltages VMR1–VMR4.

In the second and following embodiments, reference voltage producing portion 44 applies reference potentials VMR1–VMR4 similarly to the first embodiment. However, instead of the structure of supplying reference potentials VMR1–VMR4 from reference voltage producing portion 44 integrated on semiconductor integrated circuit 1000, such a structure may be employed that reference potentials VMR1–VMR4 are externally supplied from terminals of semiconductor integrated circuit 1000.

Figure 9:
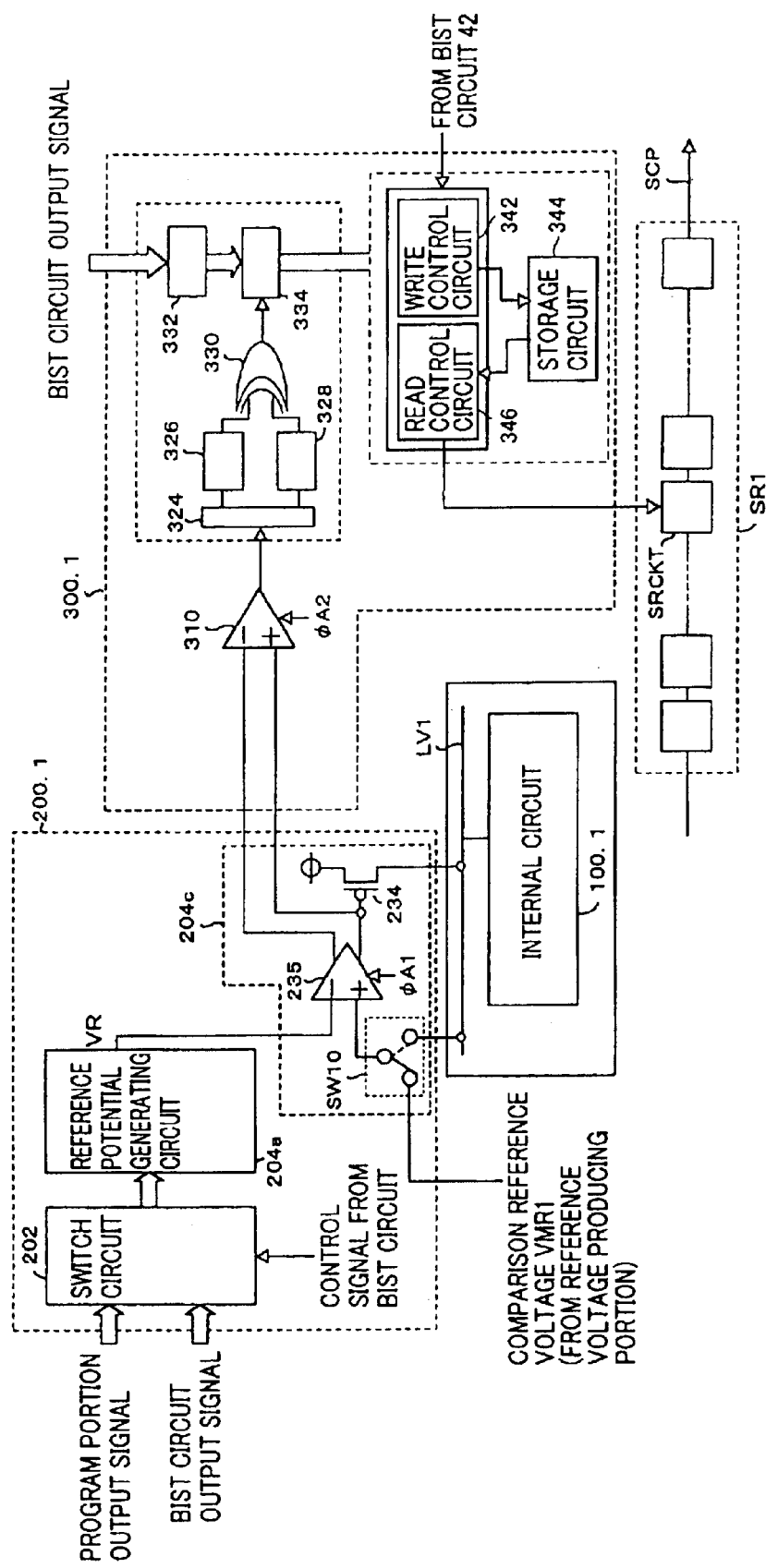
FIG. 9 is a schematic block diagram showing structures of an internal power supply potential generating circuit 200.1 and a measuring circuit 302.1 of a second embodiment of the invention.

FIG. 9 is a schematic block diagram showing structures of internal power supply potential generating circuit 200.1 and measuring circuit 300.1 of the second embodiment of the invention, and corresponds to FIGS. 4 and 5 showing the first embodiment.

Internal power supply potential generating circuit 200.1 of the second embodiment differs from internal power supply potential generating circuit 200.1 of the first embodiment in that driver circuit 204b in the first embodiment is replaced with a driver circuit 204c.

Driver circuit 204c includes a switch circuit SW10, which receives a reference voltage for comparison (e.g., comparison reference voltage VMR1) from reference voltage producing portion 44 and a voltage on internal power supply interconnection LV1 for internal circuit 100.1, and selectively outputs them under control of BIST circuit 42, comparator 235 receiving an output of switch circuit SW10 and reference potential VR sent from reference potential generating circuit 204a on its positive and negative nodes, respectively, and a P-channel MOS transistor 234, which is arranged between external power supply potential ext.Vcc and internal power supply interconnection LV1, and has a gate potential controlled by the output of comparator 235.

The measuring circuit 300.1 of the second embodiment differs from measuring circuit 300.1 of the first embodiment in that switch circuit 302 is eliminated, and comparator 310 receives the outputs of comparator 235 on its positive and negative input nodes, respectively.

Structures other than the above are similar to those of internal power supply potential generating circuit 200.1 and measuring circuit 300.1 in the first embodiment. Therefore, the same portions bear the same reference numbers, and description thereof is not repeated.

Figure 10:
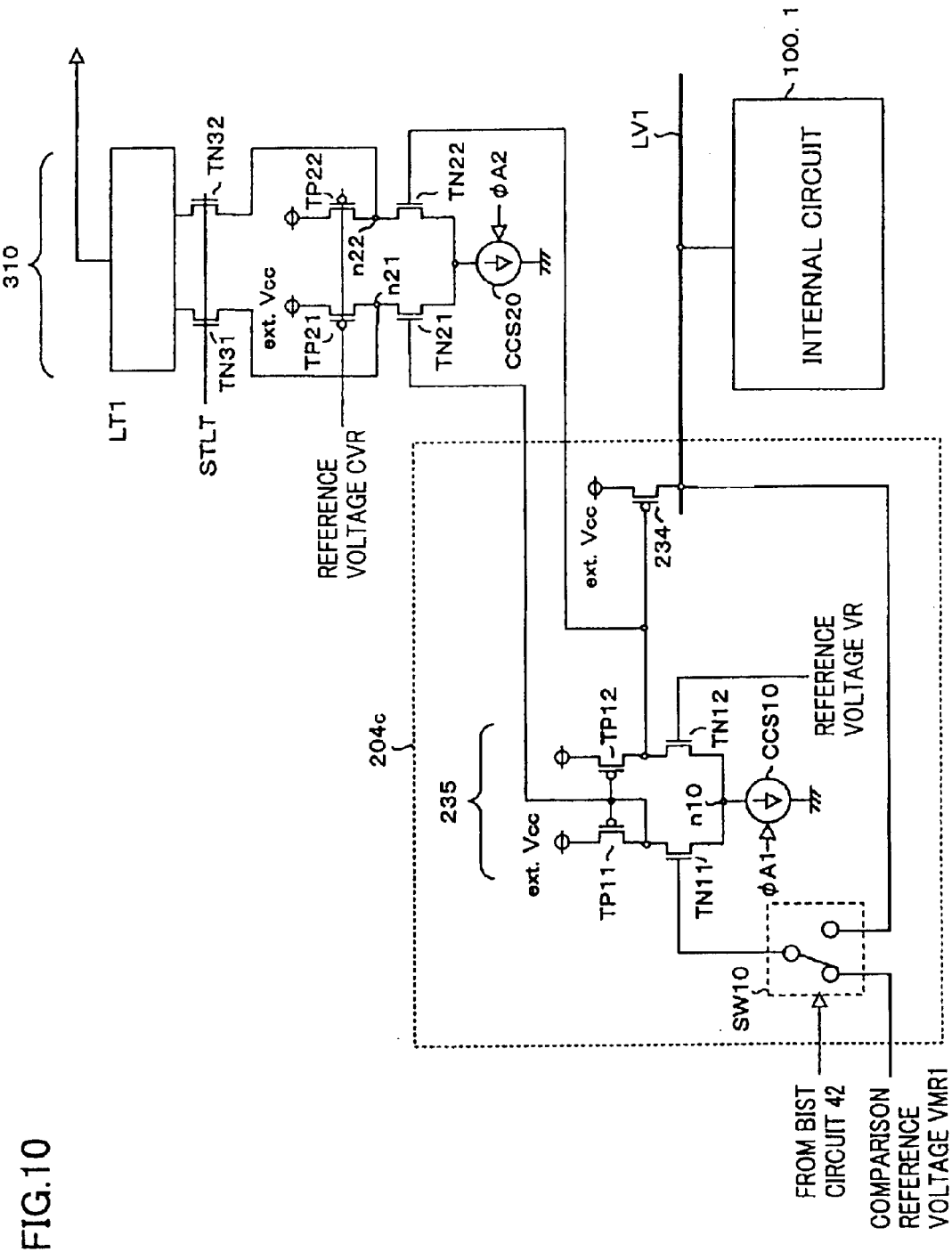
FIG. 10 is a circuit diagram showing detailed structures of a driver circuit 204 and a comparator 310 shown in FIG. 9.

FIG. 10 is a circuit diagram showing more specifically the structures of driver circuit 204c and comparator 310 shown in FIG. 9.

Referring to FIG. 10, comparator 235 includes a constant current supply CCS10, which is arranged between an internal node n10 and ground potential Vss, and is activated in response to signal φA1 sent from BIST circuit 42, P- and N-channel MOS transistors TP11 and TN11 connected in series between internal node n10 and external power supply potential ext.Vcc, and P- and N-channel MOS transistors TP12 and TN12 connected in series between external power supply potential ext.Vcc and internal node n10.

Transistor TN11 receives on its gate either comparison reference voltage VMR1 or the potential on internal power supply interconnection LV1 selectively output from switch circuit SW10. Transistor TN12 receives reference voltage VR sent from reference potential generating circuit 204a on its gate. The gates of transistors TP11 and TP12 are connected together, and the gate of transistor TP11 is coupled to a drain of transistor TP11.

Further, a coupling node between transistors TP12 and TN12 is coupled to the gate of P-channel MOS transistor 234.

Comparator 310 includes a constant current supply CCS20, which is coupled between an internal node n20 and ground potential Vss, and is activated by signal φA2 sent from BIST circuit 42, P- and N-channel MOS transistors TP21 and TN21 connected in series between internal node n20 and external power supply potential ext.Vcc, and P- and N-channel MOS transistors TP22 and TN22, which are connected in series between internal node n20 and external power supply potential ext.Vcc.

Transistor TN21 has a gate coupled to the coupling node between transistors TP11 and TN11 in comparator 235.

Transistor TN22 has a gate coupled to the coupling node between transistors TP12 and TN12 in comparator 235.

Transistors TP11 and TP12 receive a predetermined reference potential CVR for operations.

Transistors TP21 and TN21 form a connection node n21, and transistors TP22 and TN22 form a connection node n22.

Comparator 310 further includes a latch circuit LT1 for receiving and holding outputs sent from nodes n21 and n22, respectively, and an N-channel MOS transistor TN31 arranged between node n21 and latch circuit LT1, and an N-channel MOS transistor TN32 arranged between a node n22 and latch circuit LT1.

Gates of transistors TN31 and TN32 are controlled by a latch circuit take-in control signal STLT sent from BIST circuit 42.

The data held by latch circuit LT1 is output to interleave circuit 324.

Owing to the structure described above, comparator 235 compares comparison reference voltage VMR1 supplied from reference voltage producing portion 44 and reference potential VR generated by reference potential generating circuit 204a, and data corresponding to results of this comparison is held by comparator 310 after being amplified, and is finally applied to interleave circuit 324.

According to the structure shown in FIG. 9, therefore, reference potential VR, which is generated by reference potential generating circuit 204a based on the signal applied from BIST circuit 42, is directly compared with the comparison reference voltage, e.g., voltage VMR1 during a built-in self-test mode. Therefore, the comparison results can be applied to interleave circuit 324 without waiting for such a state that driver circuit 204c drives the level of internal power supply interconnection LV1, and the potential level of internal power supply interconnection LV1 becomes stable. Within a shorter time, therefore, it is possible to perform the test for determining whether reference potential VR output from reference potential generating circuit 204a is set to the potential corresponding to comparison reference voltage VMR1 or not.

Further, comparator 235 used for generating the internal power supply voltage in the normal operation is used as a comparator for comparing reference voltage VR and comparison reference voltage VMR1. This can prevents variations in results of the comparison between reference voltage VR and comparison reference voltage VMR1, which are caused, e.g., by variations in element characteristics caused during manufacturing of comparator 235.

[First Modification of the Second Embodiment]

In the structure described above, internal power supply generating circuit 200.1 supplies a lowered potential, i.e., a potential lower than external power supply potential ext.Vcc to internal power supply interconnection LV1 corresponding to internal circuit 100.1.

If the built-in self-test is to be done, however, the test can be done with an internal power supply potential higher than external power supply potential ext.Vcc.

Figure 11:
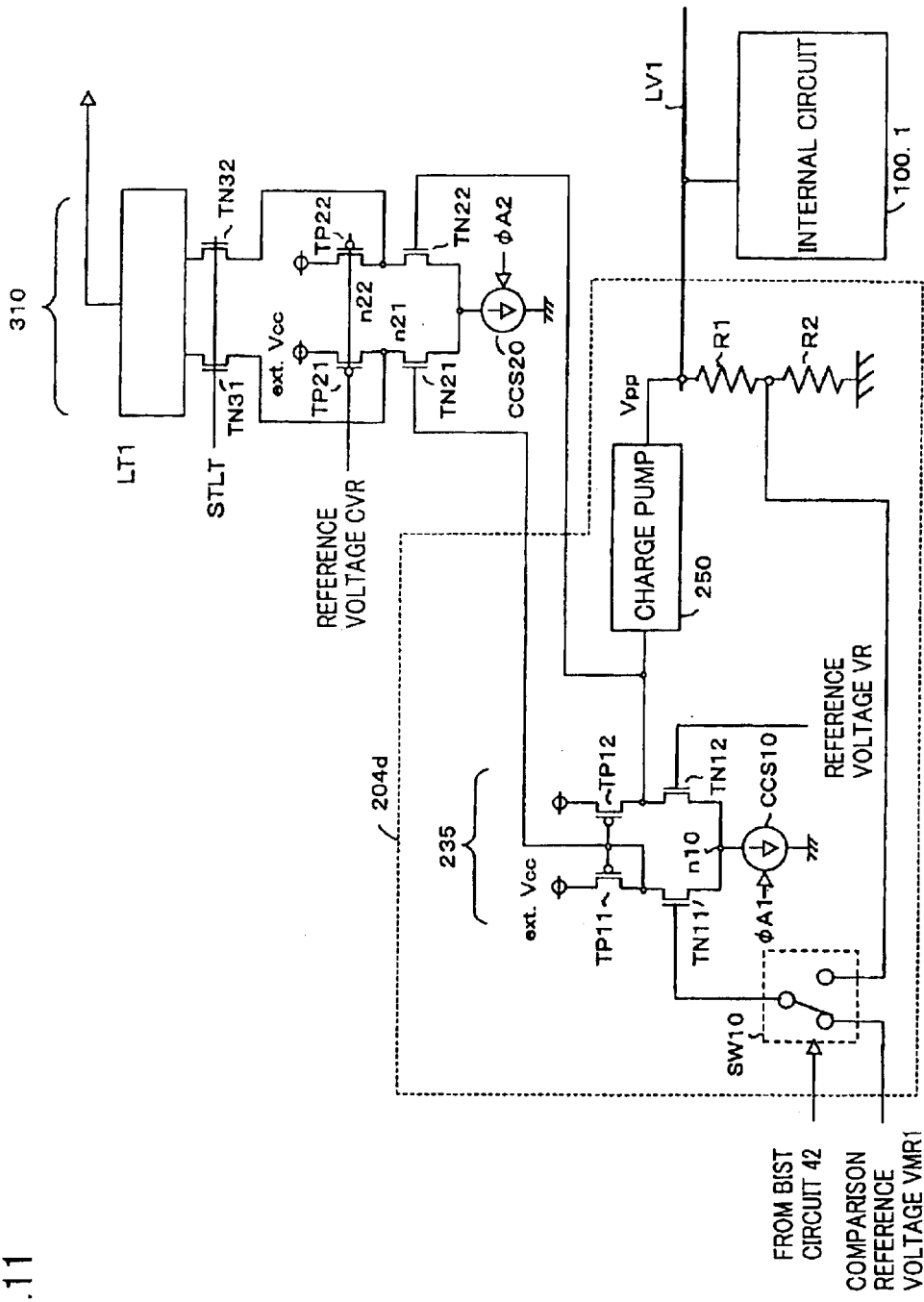
FIG. 11 is a schematic block diagram showing a situation, in which the internal power supply generating circuit 200.1 produces an internal power supply potential higher than an external power supply potential ext.Vcc.

FIG. 11 is a schematic block diagram for showing a structure, in which internal power supply generating circuit 200.1 produces such an internal power supply potential higher than external power supply potential ext.Vcc.

Referring to FIG. 11, a circuit structure differs from that shown in FIG. 10 in that a driver circuit 204d is employed instead of driver circuit 204c. The structure of driver circuit 204d differs from the structure of driver circuit 204c in that a charge pump circuit 250 is employed instead of P-channel MOS transistor 234, and is controlled in accordance with the output of comparator 235.

Charge pump circuit 250 receives external power supply potential ext.Vcc and ground potential Vss, and outputs a boosted potential Vpp higher than external power supply potential ext.Vcc.

Further, switch circuit SW10 is not directly supplied with a potential on internal power supply interconnection LV1, but is supplied with a potential level of the connection node between resistors R1 and R2, which are connected in series between internal power supply interconnection LV1 and ground potential Vss.

Accordingly, switch circuit SW10 is supplied with the voltage divided in accordance with a resistance ratio between resistors R1 and R2.

In the normal operation, charge pump circuit 250 is controlled in accordance with results of a comparison of the potential divided by resistors R1 and R2 with reference voltage VR generated by reference potential generating circuit 204a.

In the built-in self-test mode, however, comparison reference potential VMR1 supplied from reference voltage producing portion 44 is compared with reference voltage VR generated by reference potential generating circuit 204a.

As described above, the level of boosted potential Vpp is controlled in accordance with results of the comparison between boosted potential Vpp produced by charge pump circuit 250 and reference potential VR in the normal operation state. In the test mode, however, determination of whether reference potential generating circuit 204a precisely generates reference potential VR or not is performed based on comparison reference potential VMR1 applied from a system other than the circuit corresponding to internal circuit 100.1.

If reference potential VR generated by reference potential generating circuit 204a is not at an accurate level, the output of comparator 235 shifts from a balanced state to the "H" or "L" level side. This state is amplified by comparator 310 in the next stage, and is taken into latch circuit LT1.

By performing tuning based on the signal sent from BIST circuit 42, reference voltage VR generated by reference potential generating circuit 204a is gradually changed when conducting the test. Thereby, the output of comparator 310 changes from "H" level to "L" level or vice versa at a certain point during the change. This point of change represents a point, at which reference voltage VR generated by reference potential generating circuit 204a takes a desired value. Accordingly, reference voltage VR can be internally and correctly generated by tuning the program output signal applied to reference potential generating circuit 204a so that reference potential VR at the level corresponding to this point may be generated.

In the normal operation, comparator 235 performs the comparing operation based on the voltage divided by the voltage dividing circuit, which is formed of resistors R1 and R2. However, this voltage dividing circuit is not included in the circuits to be operated for the test. By using the same material in the resistors R1 and R2 used for the voltage division, the voltage dividing ratio itself can be determined without an error. Therefore, reference potential VR can be tuned sufficiently correctly even by the test shown in FIG. 11.

In the normal operation, comparator 235 used for generating the internal power supply voltage is used as the comparator for comparing reference voltage VR with comparison reference voltage VMR1. Thereby, it is possible to prevent such a situation that variations occur in results of the comparison made between reference voltage VR generated by reference potential generating circuit 204a and comparison reference voltage VMR1 due to variations caused in characteristics during manufacturing of comparator 235.

Since it is not necessary to drive internal power supply interconnection LV1, the test can be conducted with reference voltage VR produced by reference voltage generating circuit 204a within a further reduced test time.

[Second Modification of the Second Embodiment]

In the first modification of the second embodiment described above, internal power supply generating circuit 200.1 generates boosted potential Vpp higher than external power supply potential ext.Vcc.

Instead of the boosted potential, the internal power supply generating circuit may generates a negative potential such as a substrate potential–Vsub lower than ground potential Vss.

A second modification of the second embodiment will be described in connection with a structure, which allows a similar test operation with such a negative potential.

Figure 12:
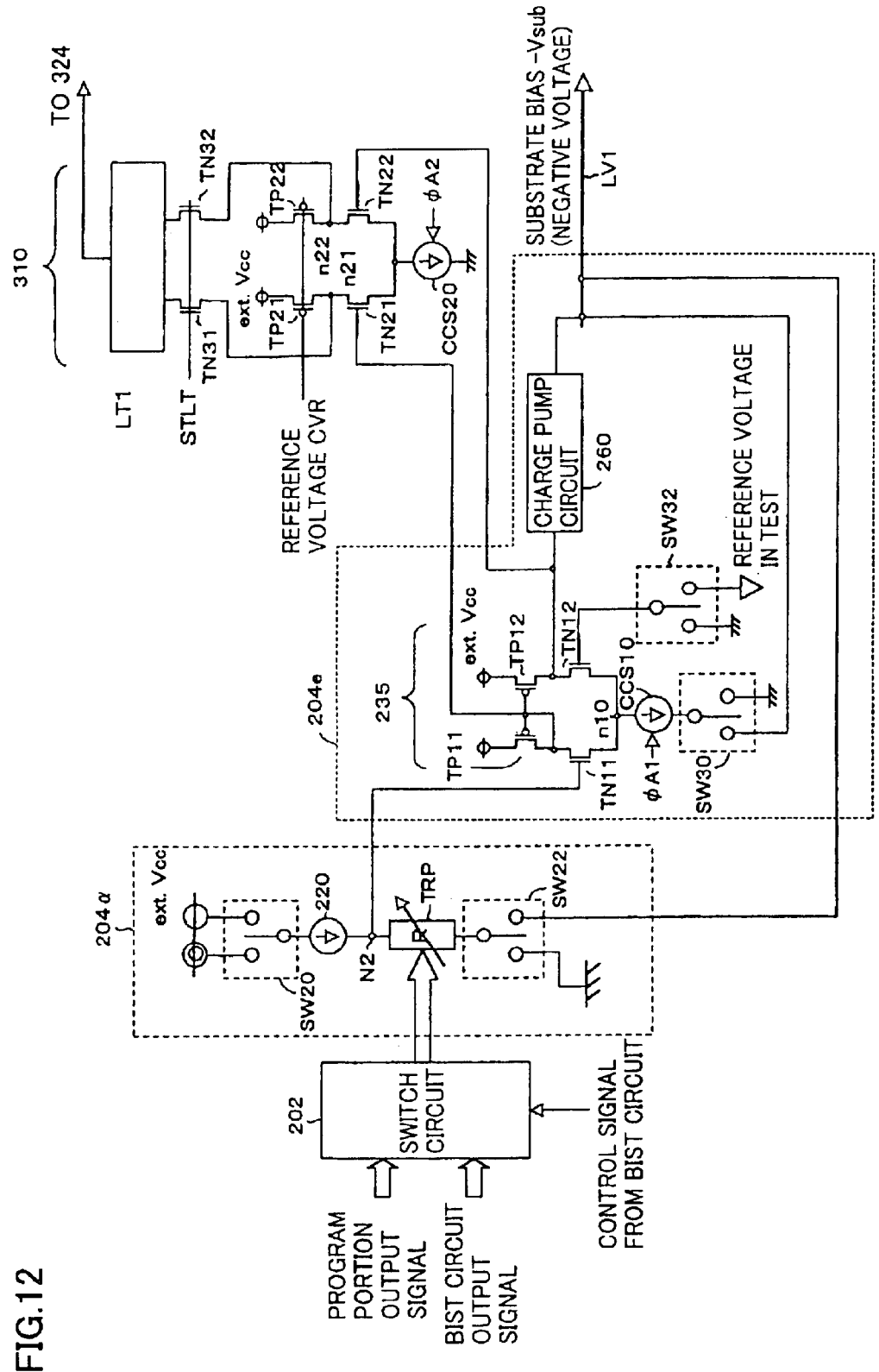
FIG. 12 is a schematic block diagram fragmentarily showing structures of the internal power supply generating circuit 200.1 and measuring circuit 300.1.

FIG. 12 is a schematic block diagram fragmentarily showing structures of internal power supply generating circuit 200.1 and measuring circuit 300.1 of the second modification of the second embodiment.

The structure of internal power supply generating circuit 200.1 of the second modification of the second embodiment differs from that of internal power supply generating circuit 200.1 shown in FIG. 4 in that reference potential generating circuit 204α is employed instead of reference potential generating circuit 204a.

The structure of reference potential generating circuit 204α differs from reference potential generating circuit 204a shown in FIG. 4 in that a switch circuit SW20 is employed for supplying a power supply potential to constant current supply 220. Under control of BIST circuit 42, switch circuit SW20 supplies to constant current supply 220 either external power supply potential ext.Vcc or a potential, which is higher than external power supply potential ext.Vcc by a potential corresponding to an absolute value of a predetermined potential level depending on the negative potential generated by internal power supply generating circuit 200.1, as will be described later.

Further, reference potential generating circuit 204α is provided with a switch circuit SW22 for supplying the power supply potential to a tuning resistance portion TRP. Switch circuit SW22 applies to tuning resistance portion TRP either ground potential Vss or negative voltage–Vsub supplied from internal power supply generating circuit 200.1 under control of BIST circuit 42.

The potential, which is applied to switch circuit SW20 and is higher than external power supply potential ext.Vcc, is not particularly restricted, but may be externally supplied through an external terminal of semiconductor integrated circuit 1000.

The structure of internal power supply potential generating circuit 200.1 further differs from the structure of internal power supply potential generating circuit 200.1 of the first embodiment shown in FIG. 9 in that a driver circuit 204e is employed instead of driver circuit 204b. Driver circuit 204e differs from driver circuit 204b in that a charge pump circuit 260 for producing a negative potential is employed instead of P-channel MOS transistor 234, and charge pump circuit 260 drives the potential level of internal power supply interconnection LV1 to the negative potential in accordance with the output of comparator 235.

Further, comparator 235 is provided with a switch circuit SW30 corresponding to constant current supply CCS10. Switch circuit SW30 supplies either ground potential Vss or the potential of internal power supply interconnection LV1 to constant current supply CCS10 under control of BIST circuit 42.

Further, transistor TN11 receives on its gate the output of reference potential generating circuit 204α.

A switch circuit SW32 is provided corresponding to the gate of transistor TN12. Switch circuit SW32 is controlled by BIST circuit 42 to apply to the gate of transistor TN12 either ground potential Vss or a potential |Vsub|, which corresponds to the absolute value of negative potential–Vsub supplied from charge pump circuit 260. This potential |Vsub| is not particularly restricted, and may be externally supplied through an external terminal of semiconductor integrated circuit 1000.

Structures other than the above are the same as those of internal power supply generating circuit 200.1 and measuring circuit 300.1 of the first embodiment. The same portions bear the same reference numbers, and description thereof is not repeated.

Figure 13:
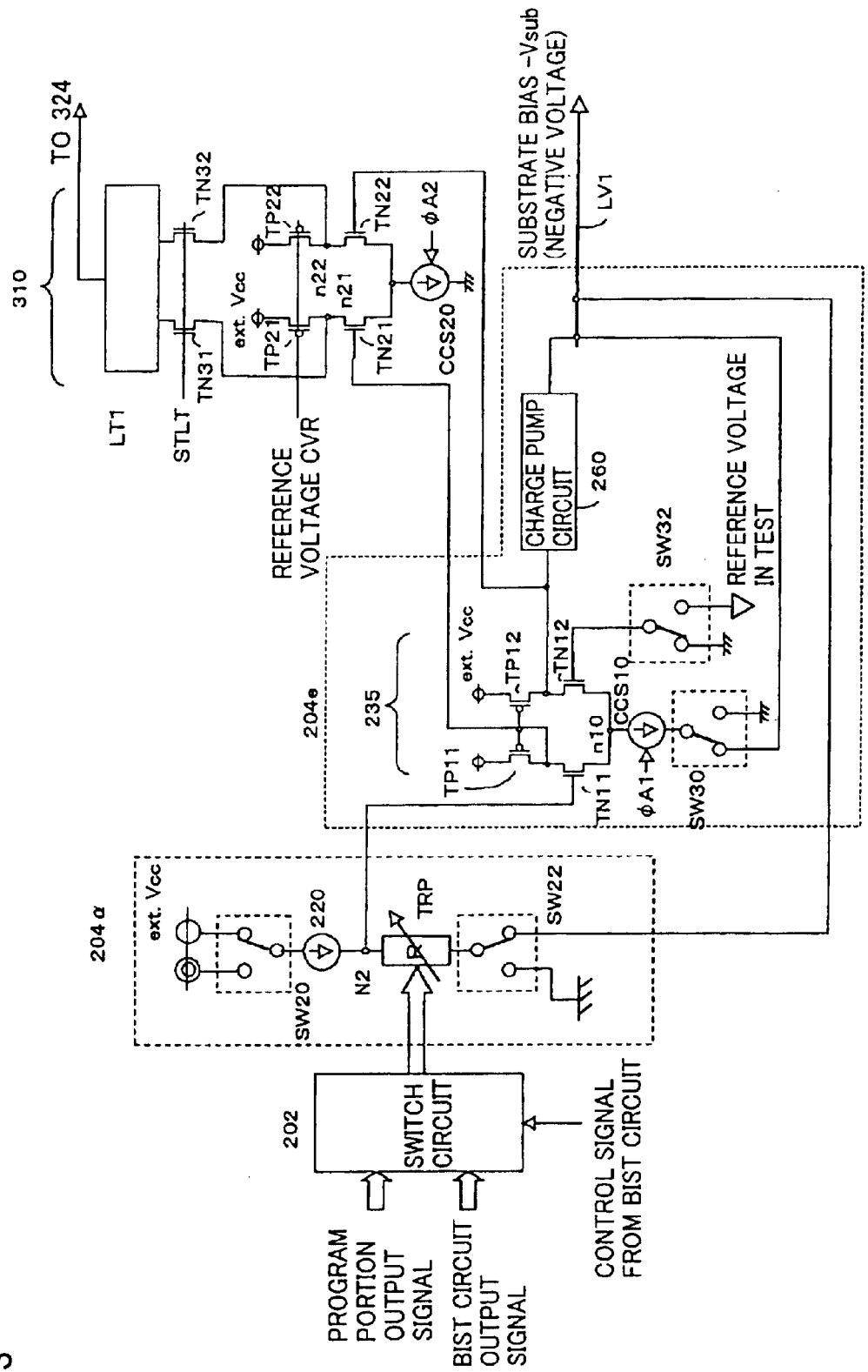
FIG. 13 is a diagram showing connection states of switch circuits SW20–SW32 in the structure shown in FIG. 12 during a normal operation.

FIG. 13 shows connection states of switch circuits SW20–SW32 in the structure shown in FIG. 12 during the normal operation.

In the normal operation, transistor TN12 of comparator 235 receives on its gate the ground potential. Constant current supply CCS10 of comparator 235 is coupled to the output of charge pump circuit 260. In reference potential generating circuit 204α, switch circuit SW20 applies external power supply potential ext.Vcc to constant current supply 220, and switch circuit SW22 applies the output of charge pump circuit 260 to tuning resistance portion TRP.

In the normal operation, the comparison reference voltage applied to comparator 235 is equal to the ground potential as described above, and therefore an error does not occur in the comparison reference voltage.

By tuning the resistance value of tuning resistance portion TRP, transistor TN11 in comparator 235 is supplied with a level, which is prepared by dividing external power supply potential ext.Vcc and negative potential –Vsub in accordance with a value of tuning resistance portion TRP.

The operation of charge pump circuit 260 is controlled in accordance with comparison of this reference potential VR applied to comparator 235 with the ground potential.

Accordingly, the negative potential attains the level equal to:

(Ground potential Vss)−((current value of constant current supply 220)×(tuning resistance value))

Figure 14:
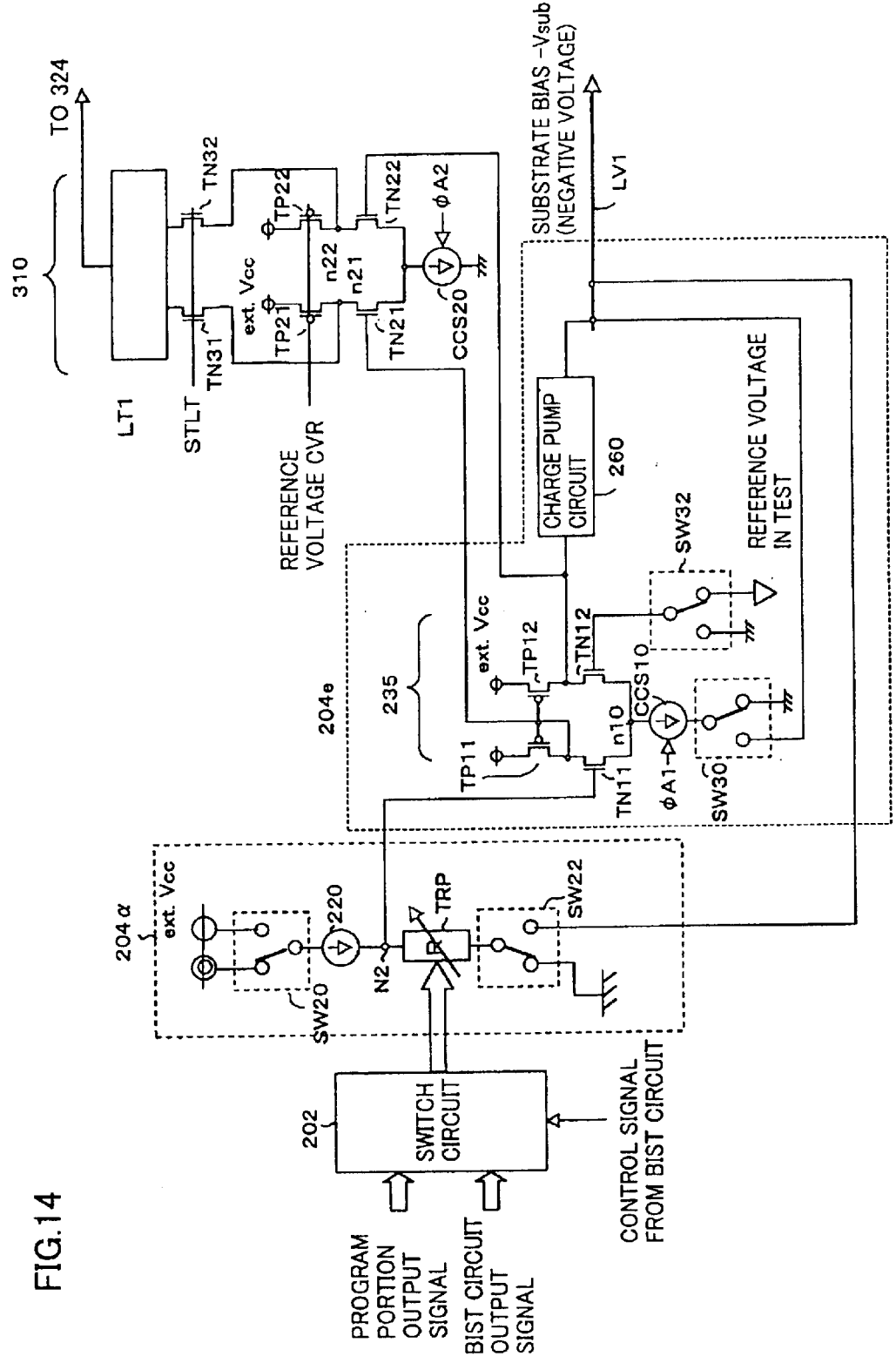
FIG. 14 is a diagram showing connection states of switch circuits SW20–SW32 in the structure shown in FIG. 12 during a built-in self-test mode.

FIG. 14 is a circuit diagram showing the built-in self-test mode of the circuits shown in FIG. 12, and particularly showing connection states of switch circuits SW20–SW32.

For the sake of simplicity, it is assumed in the following description that charge pump circuit 260 outputs a negative potential at a level of −1V.

During the built-in self-test mode, switch circuit SW22 is set to the position for supplying ground potential Vss to tuning resistance portion TRP under the control of BIST circuit 42. Further, switch circuit SW20 requests constant current supply 220 to supply a potential, which is higher than external power supply potential ext.Vcc by the absolute value of negative potential−Vsub, and therefore is equal to (ext.Vcc+1) volt.

Constant current supply CCS10 in comparator 235 is supplied with ground potential Vss from switch circuit SW30, and transistor TN12 in comparator 235 receives on its gate the potential corresponding to the absolute value of negative potential−Vsub (e.g., potential of 1V) instead of ground potential Vss from switch circuit SW32.

Thereby, the potentials in the circuits operating during the built-in self-test are shifted by the voltage of absolute value of the negative potential to be output from charge pump circuit 260, and thus by 1V in this case, and the comparator 235 and others can operate with the potentials thus shifted. Accordingly, the operations of the circuits, which are being tested for tuning the value of tuning resistance TRP, can be switched to operations with potentials between the ground potential and the power supply potential without causing imbalances in the circuit operations.

In the above state, the tests are conducted while gradually changing the value of tuning resistance portion TRP in accordance with the signal sent from BIST circuit 42. During the tests, the output of comparator 235 changes from "H" level to "L" level or vice versa at a certain point. This point represents an optimum tuning value. By programming the program portion to issue the output signal, which corresponds to the output signal sent from BIST circuit at this point in time, internal power supply generating circuit 200.1 can generate the negative potential at an intended level.

By performing the built-in self-test in the above manner, comparator 235, which is used for generating the internal power supply potential, can be used for comparing the output level of reference potential generating circuit 204α to be tuned with the intended internal power supply potential. Therefore, the tuning can be performed accurately without an influence by variations in characteristics of the elements caused in manufacturing steps of comparator 235 and others.

Since the tuning does not require driving of the potential level of internal power supply interconnection LV1 to the intended negative potential, the time required for the tuning can be reduced.

According to the above structure, the voltages used in circuit operations are shifted so that the voltage relationship, which is the same as that in the normal operation, can be maintained during the tuning operation without generating a negative voltage. This improves the tuning accuracy.

[Third Embodiment]

Figure 15:
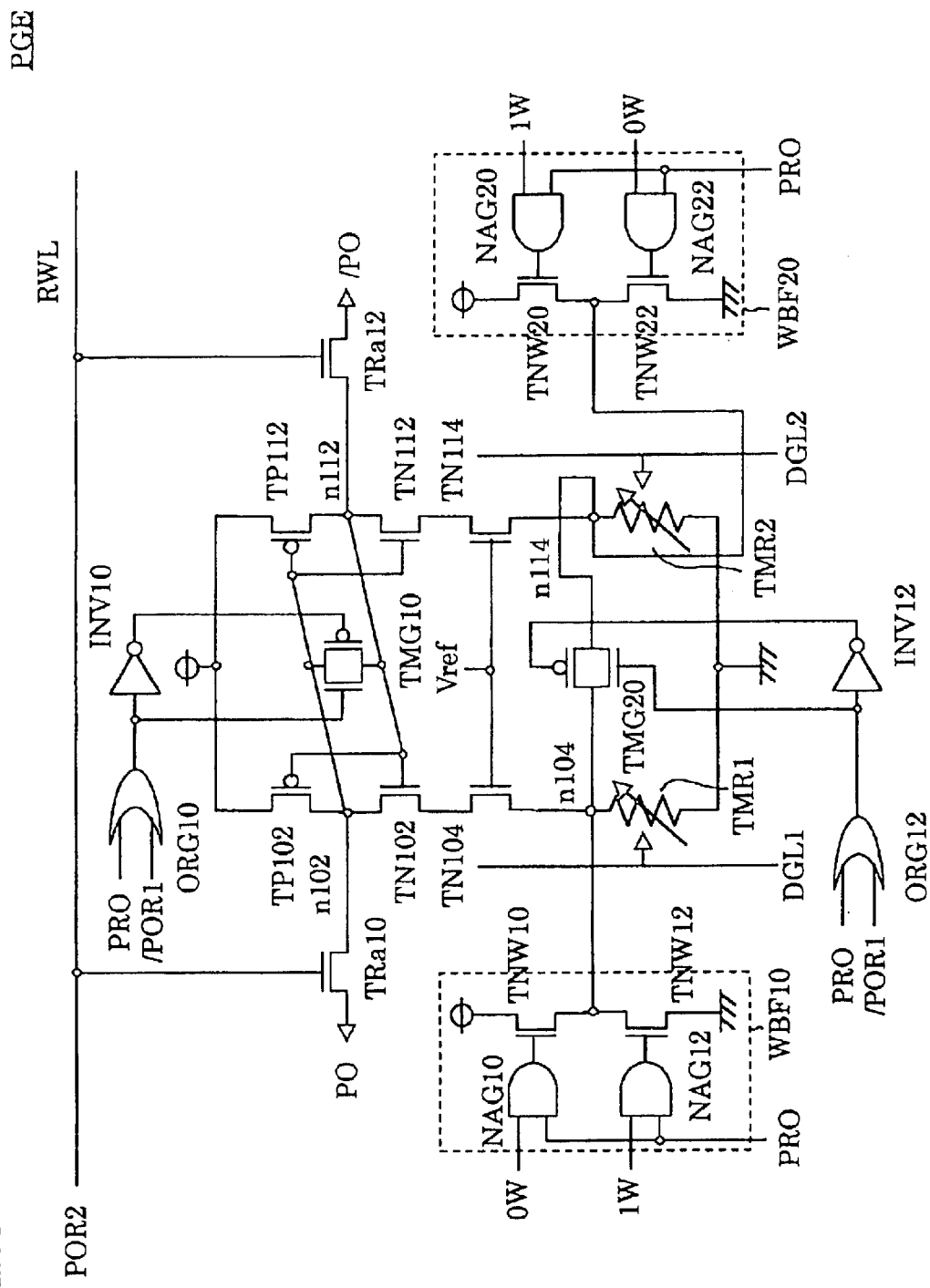
FIG. 15 shows by way of example a program element arranged in a program portion 46 shown in FIG. 2.

FIG. 15 shows by way of example a program element arranged in program portion 46 shown in FIG. 2.

The storage element of program portion 46 may be formed of a floating gate type of transistor, which is generally used, e.g., in a flash memory.

However, description with reference to FIG. 15 will be given only on a structure, in which the program element is formed of a magneto-resistance element.

Figure 32:
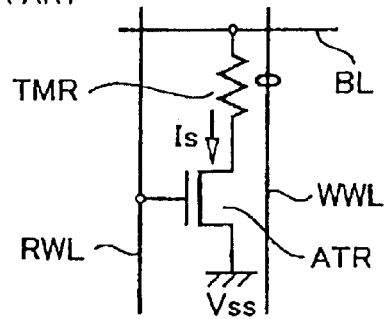
FIG. 32 schematically shows a structure of a memory cell having a magnetic tunnel junction.
Figure 33:
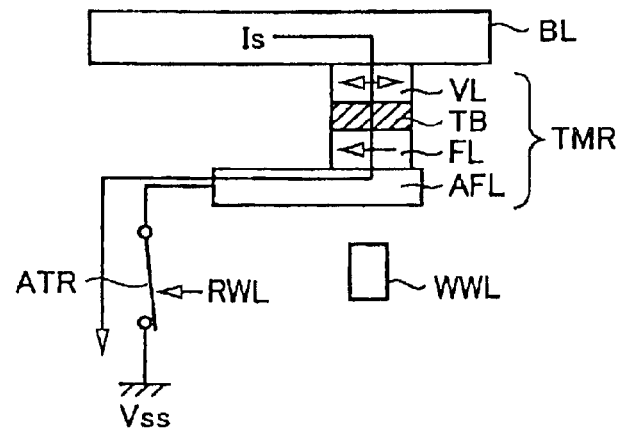
FIG. 33 conceptually shows an operation of reading data from a MTJ memory cell.

The magneto-resistance element is formed of a TMR element, which is the same as that already described with reference to FIG. 32.

A program signal output can be applied to tuning resistance portion TRP based on the complementary data, which are stored in the foregoing storage elements formed of the TMR elements.

Referring to FIG. 15, a programming element PGE includes a P-channel MOS transistor TP102, an N-channel MOS transistor TN102, an N-channel MOS transistor TN104 and a TMR element TMR1, which are connected in series between external power supply potential ext.Vcc and ground potential Vss, and also includes a P-channel MOS transistor TP112, an N-channel MOS transistor TN112, an N-channel MOS transistor TN114 and a TMR element TMR2, which are connected in series between external power supply potential ext.Vcc and ground potential GND.

Transistors TP102 and TN102 have gates coupled together, and transistors TP112 and TN112 have gates coupled together.

The connection node between transistors TP102 and TN102 is referred to as a node n102, and the connection node between transistors TP112 and TN112 is referred to as a node n112.

The gate of transistor TP112 is coupled to node n102, and the gate of transistor TN102 is coupled to node n112.

A coupling node between transistor TN104 and TMR element TMR1 is referred to as a node n104, and a coupling node between transistor TN114 and TMR element TMR2 is referred to as a node n114.

Programming element PGE further includes a transmission gate TMG10, which is arranged between nodes n102 and n112 for connecting them together, and a transmission gate TMG20, which is arranged between nodes n104 and n114 for connecting them together.

Programming element PGE further includes an OR circuit ORG10 receiving a signal PRO, which attains the active state ("H" level) in the write operation (programming operation), and an inverted signal /POR1 of a first power-on reset signal POR1, which attains "H" level when a predetermined time elapses after the power-on, and also includes an inverter INV10 receiving the output of OR circuit ORG10. An N-channel MOS transistor forming transmission gate TMG10 receives on its gate an output of OR circuit ORG10, and a P-channel MOS transistor forming transmission gate TMG10 receives on its gate an output of inverter INV10.

Programming element PGE further includes an OR circuit ORG 12 receiving signals PRO and/POR1, and inverter INV12 receiving the output of OR circuit ORG 12. The output of OR circuit ORG 12 is applied to the gate of an N-channel MOS transistor forming transmission gate TMG2O, and the output of inverter INV12 is applied to the gate of a P-channel MOS transistor forming transmission gate TMG2O.

Programming element PGE further includes an OR circuit ORG12 receiving signals PRO and /POR1, and inverter INV12 receiving the output of OR circuit ORG12. The output of OR circuit ORG12 is applied to the gate of an N-channel MOS transistor forming transmission gate TMG20, and the output of inverter INV12 is applied to the gate of a P-channel MOS transistor forming transmission gate TMG20.

Programming element PGE further includes a write buffer WBF10. Write buffer WBF10 includes a NAND circuit NAG10 receiving signal PRO and a signal 0W, which becomes active when writing "L" level in the programming operation, a NAND circuit NAG12 receiving signal PRO and a signal 1W, which becomes active when writing "H" level in the programming operation, and N-channel MOS transistors TNW10 and TNW12 connected in series between power supply potential ext.Vcc and ground potential Vss. Transistor TNW10 receives the output of NAND circuit NAG10 on its gate, and transistor TNW12 receives the output of NAND circuit NAG12 on its gate.

A connection node between transistors TNW10 and TNW12 is coupled to node n104.

Programming element PGE further includes a write buffer WBF2O. Write buffer WBF2O includes a NAND circuit NAG2O receiving signal PRO and a signal 1W, which becomes active when writing "H" level in the programming operation, and a NAND circuit NAG22 receiving signal PRO and a signal 0W, which becomes active when writing "L" level, and N-channel MOS transistors TNW2O and TNW22 connected in series between external power supply potential ext.Vcc and ground potential Vss. Transistor TNW2O receives the output of NAND circuit NAG2O on its gate, and transistor TNW22 receives the output of NAND circuit NAG22 on its gate.

A connection node between transistors TNW20 and TNW22 is coupled to node n114.

Programming element PGE further includes a digit line DGL1 for producing a magnetic field applied for data writing to TMR element TMR1, and a digit line DGL2 for producing a magnetic field applied for data writing to TMR element TMR2.

Figure 34:
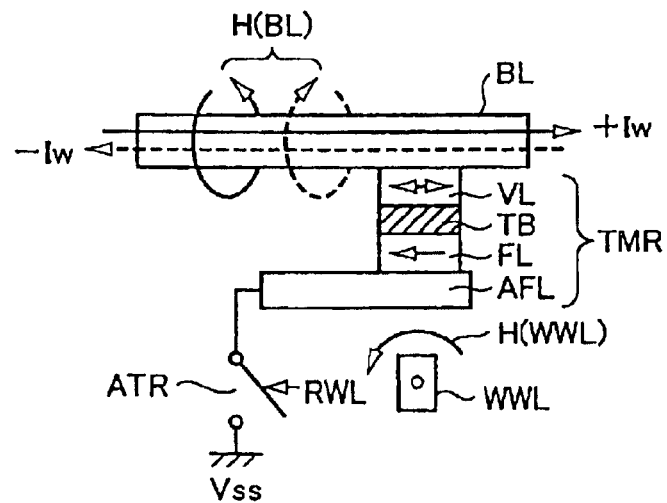
FIG. 34 conceptually shows an operation of writing data into a MTJ memory cell.
Figure 35:
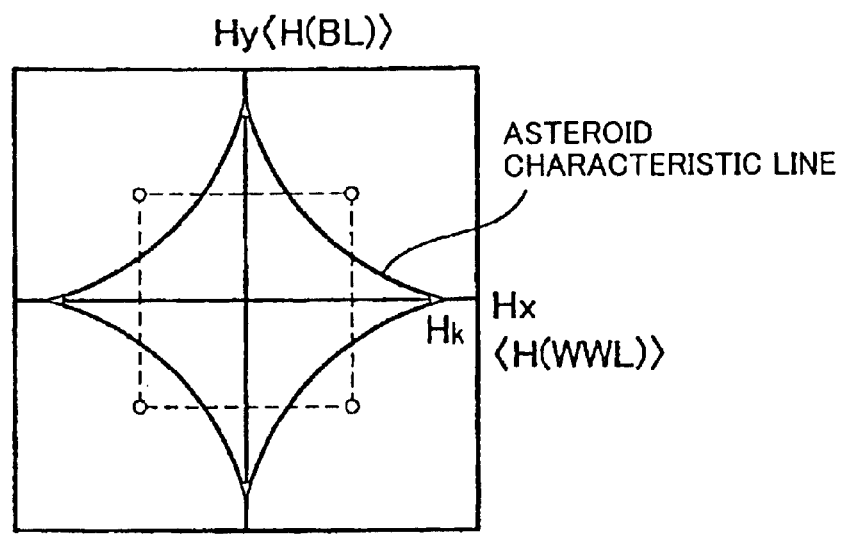
FIG. 35 conceptually shows a relationship between a direction of a data write current and a magnetization direction in the data write operation.

Digit lines DGL1 and DGL2 function as write word lines, which are already described with reference to FIG. 34, with respect to TMR elements TMR1 and TMR2, respectively.

The interconnections between nodes n104 and n114 are arranged such that the current values supplied from the write buffers have opposite directions in TMR elements TMR1 and TMR2, respectively.

Owing to the above structure, data are written into TMR elements TMR1 and TMR2 in accordance with the level of the write data such that one and the other of TMR elements TMR1 and TMR2 may have high and low resistances, respectively.

Transistors TN104 and TN114 are supplied with a reference potential Vref on their gates.

Accordingly, the potential levels of nodes n104 and n114 do not rise to or above the potential of (Vref−Vth), where Vth represents a threshold voltage of each of transistors TN104 and TN114. Therefore, breakdown of the TMR elements is prevented.

Transistors TN102 and TN112 as well as transistors TP102 and TP112 form latch circuits. As a result, TMR elements TMR1 and TMR2 carrying complementary data are arranged on the source sides of transistors TN102 and TN112 forming the latch circuit, respectively. Alternatively, such a structure may be employed that TMR elements TMR1 and TMR2 carrying complementary data are arranged on the source sides of transistors TP102 and TP112, respectively.

Immediately after semiconductor integrated circuit 1000 is formed, both the resistance elements are set to the states having small resistance values, and therefore the resistance value of either of the resistance elements is set to a high value by the write operation.

Figure 16:
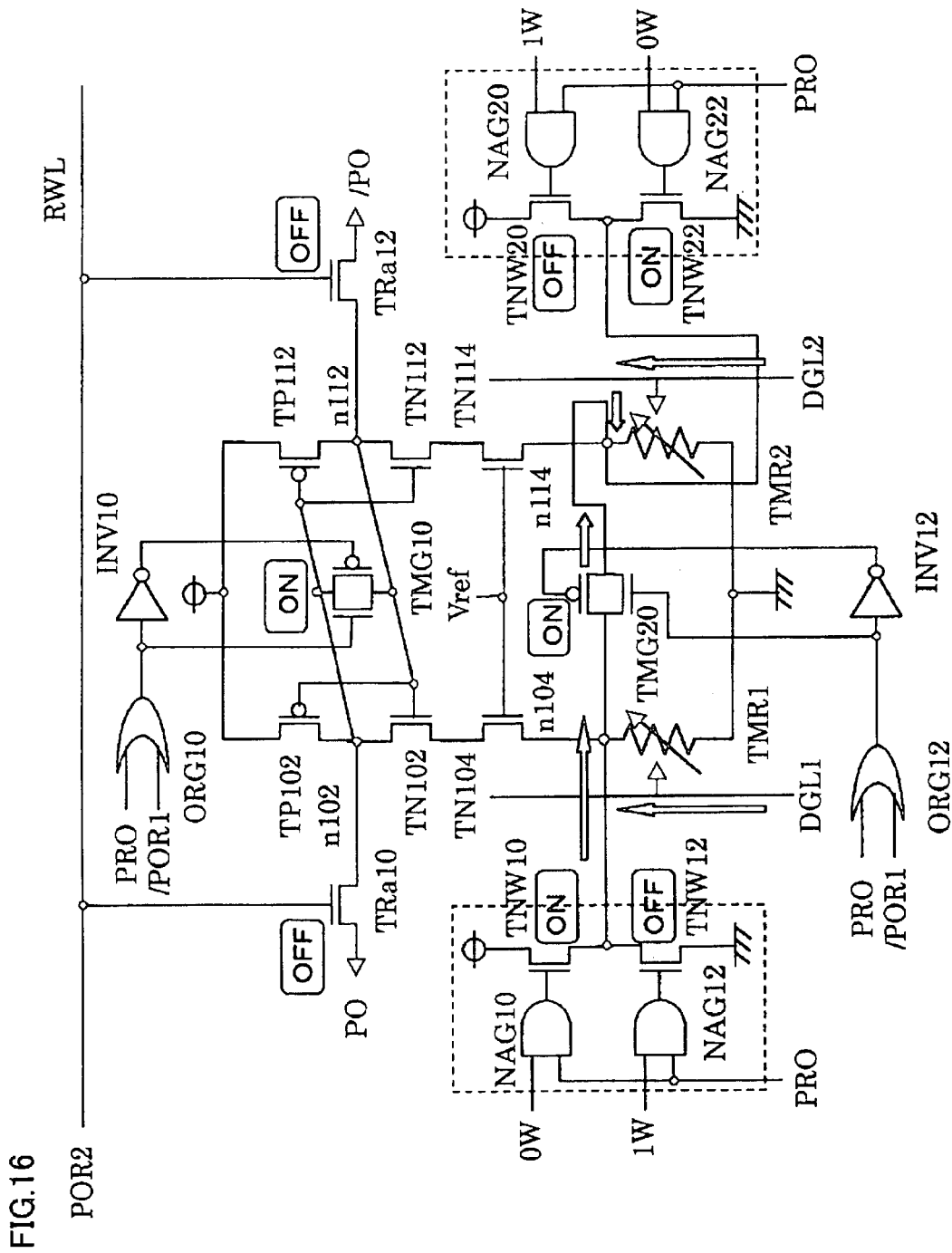

FIG. 16 conceptually shows operations during the programming of programming element PGE and after the power-on.

During the programming, signal PRO is at "H" level, and both transmission gates TMG1O and TMG2O are on. In this state, each of write buffers WBF10 and WBF2O passes a current to one side of the corresponding TMR element, and at the same time, write buffers WBF10 and WBF2O pass currents to both digit lines DGL1 and DGL2 in the same direction. The currents flowing through digit line DGL1 or DGL2 as well as the interconnection between nodes n104 and n114 form a magnetic field, which changes the resistance value of the TMR element. The digit lines carry the currents in the same direction, as described before, but the current flowing between nodes n104 and n114 of the TMR elements changes its direction depending on the data to be written.

The interconnections are arranged in the opposite directions to provide the current directions, which form magnetic fields complementary to each other, in TMR elements TMR1 and TMR2, respectively.

It is assumed that TMR element TMR1 on the left side in FIG. 16 has a small resistance value, and TMR element TMR2 on the right side has a large resistance value as a result of the writing.

Description will now be given on the operation of reading out data from programming element PGE.

After the power-on, two kinds of power-on reset signals POR1 and POR2 rise such that signal POR2 becomes active after elapsing of a predetermined time from activation of signal POR1.

For a predetermined period after the power-on, both signals POR1 and POR2 maintain "L" level as described before so that internal nodes n102 and n112 are short-circuited by transmission gate TMG10, and nodes n104 and n114 are also short-circuited by transmission gate TMG2O.

Figure 18:
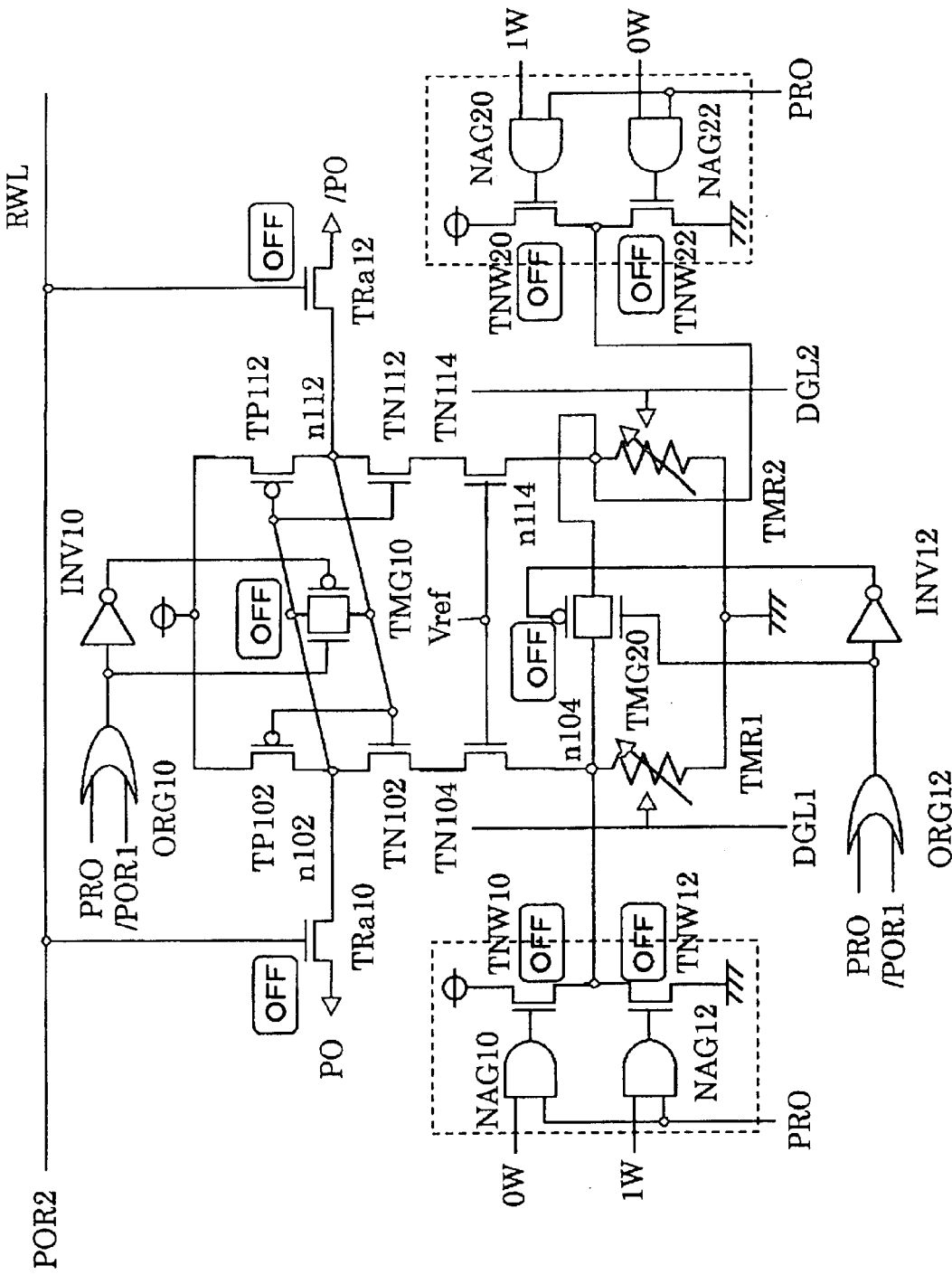
FIG. 18 conceptually shows a state of programming element PGE before a signal POR2 rises after rising of signal POR1.

FIG. 18 conceptually shows a state of programming element PGE during a period after rising of signal POR1 and before rising of signal POR2.

When signal POR1 rises to "H" level, the short-circuited state is released so that the latch circuit formed of transistors TP102, TN102, TP112 and TN112 starts the operation, and the potentials on nodes n102 and n112 tend to attain either "L" level or "H" level. Since the TMR elements have different resistance values, nodes n102 and n112 are discharged by different amounts, respectively, and the potentials change at different rates or speeds so that the data level held by the latch circuit is determined.

According to the programming already shown in FIG. 16, the discharge is performed by a smaller amount through transistor TN112 corresponding to TMR element TMR2 having a large resistance value, and therefore pulling to the "L" level is weak so that the potential on node n112, which corresponds to the N-channel MOS transistor on the side of the weak pulling, shifts toward a higher side.

Figure 19:
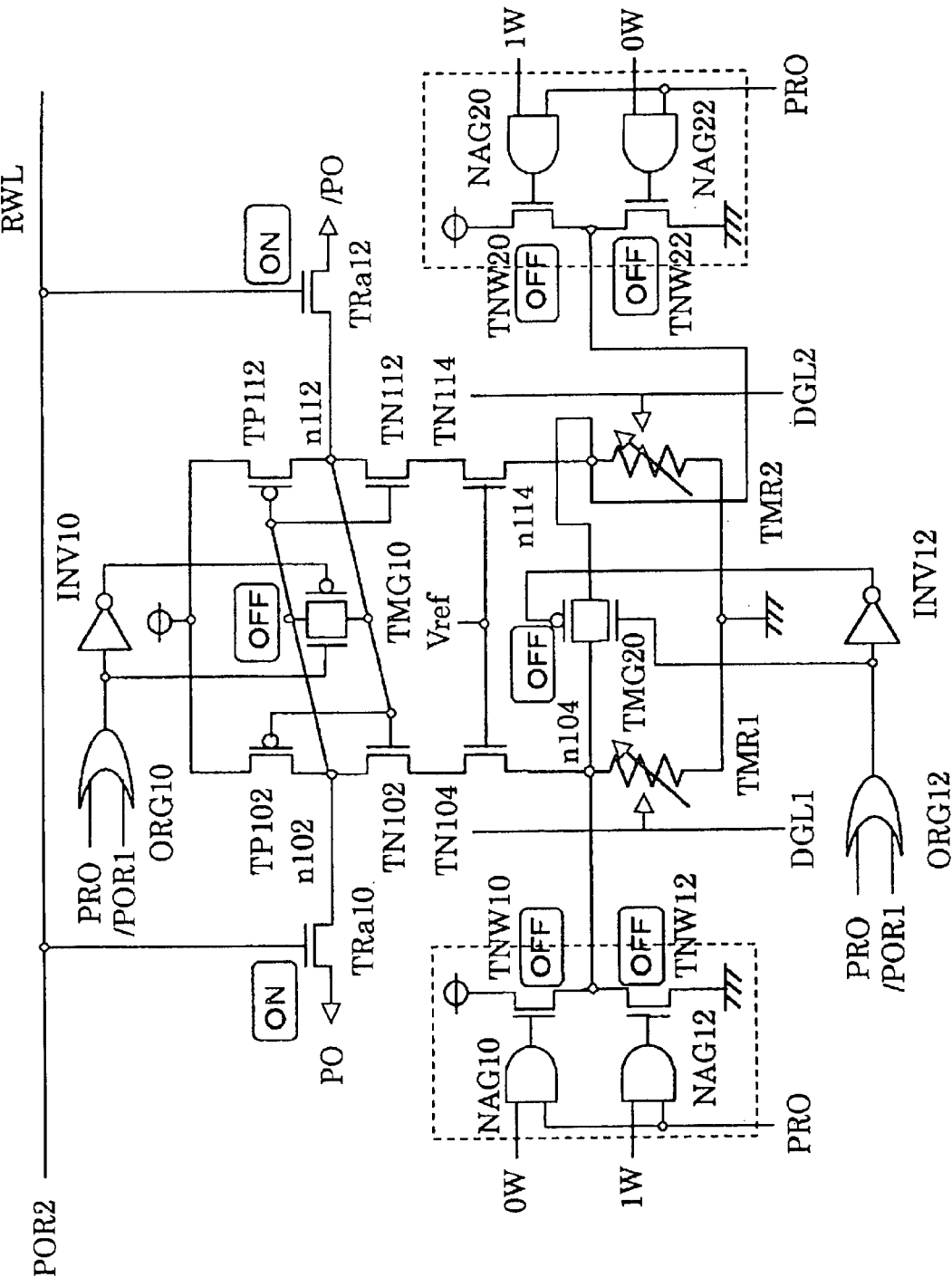
FIG. 19 conceptually shows a state of programming element PGE after signals POR1 and POR2 rise.

FIG. 19 conceptually shows a state of programming element PGE after rising of both signals POR1 and POR2.

In this case, the level of read word line RWL supplied with signal POR2 attains "H" level in accordance with activation of signal POR2 so that both access transistors TRa10 and TRa12 are turned on. In accordance with this, data stored in programming element PGE are read out as data PO and /PO.

Figure 20:
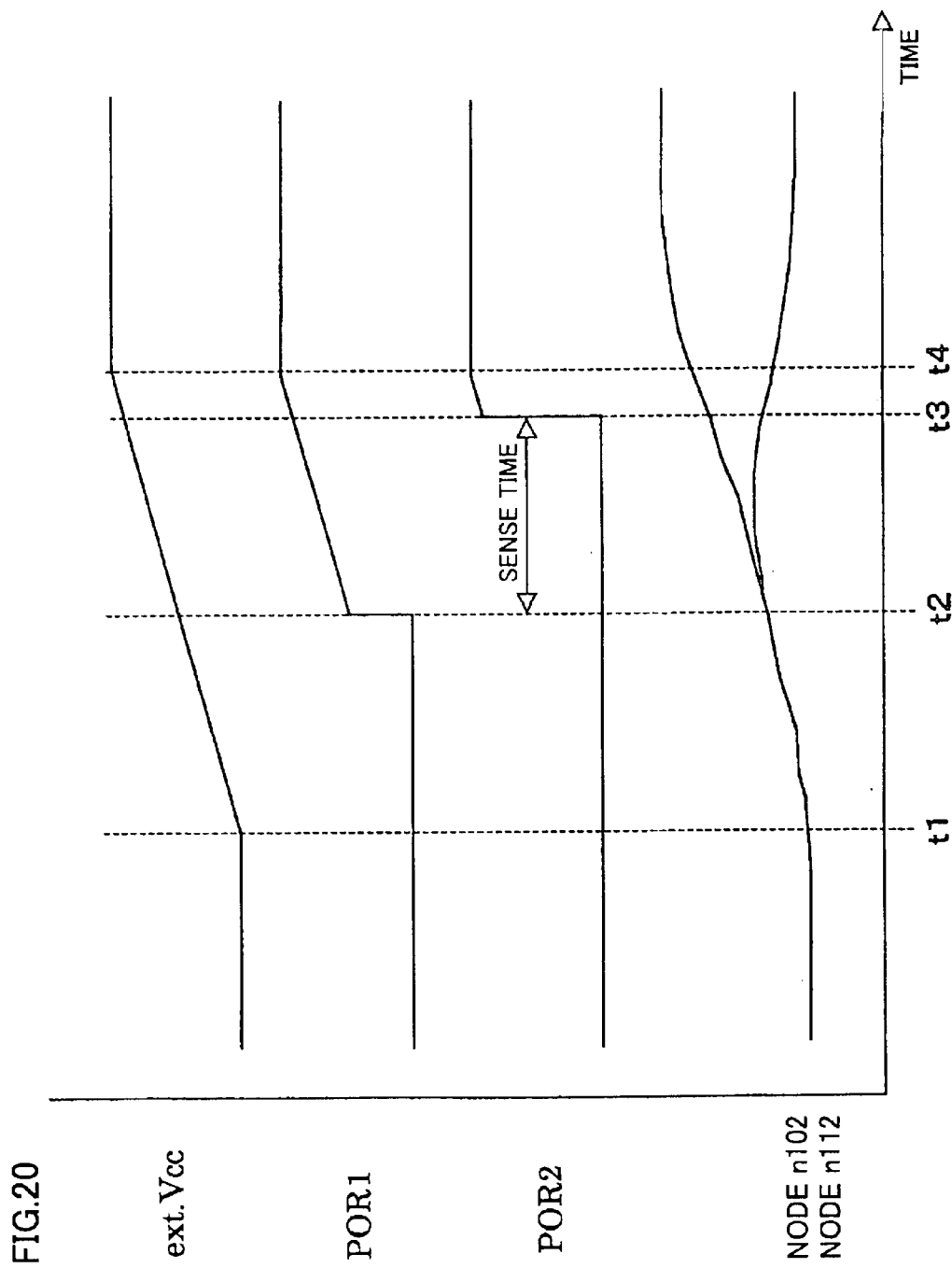
FIG. 20 is a timing chart representing a read operation for programming element PGE shown in FIG. 15.

FIG. 20 is a timing chart representing a read operation for programming element PGE shown in FIG. 15.

Figure 17:
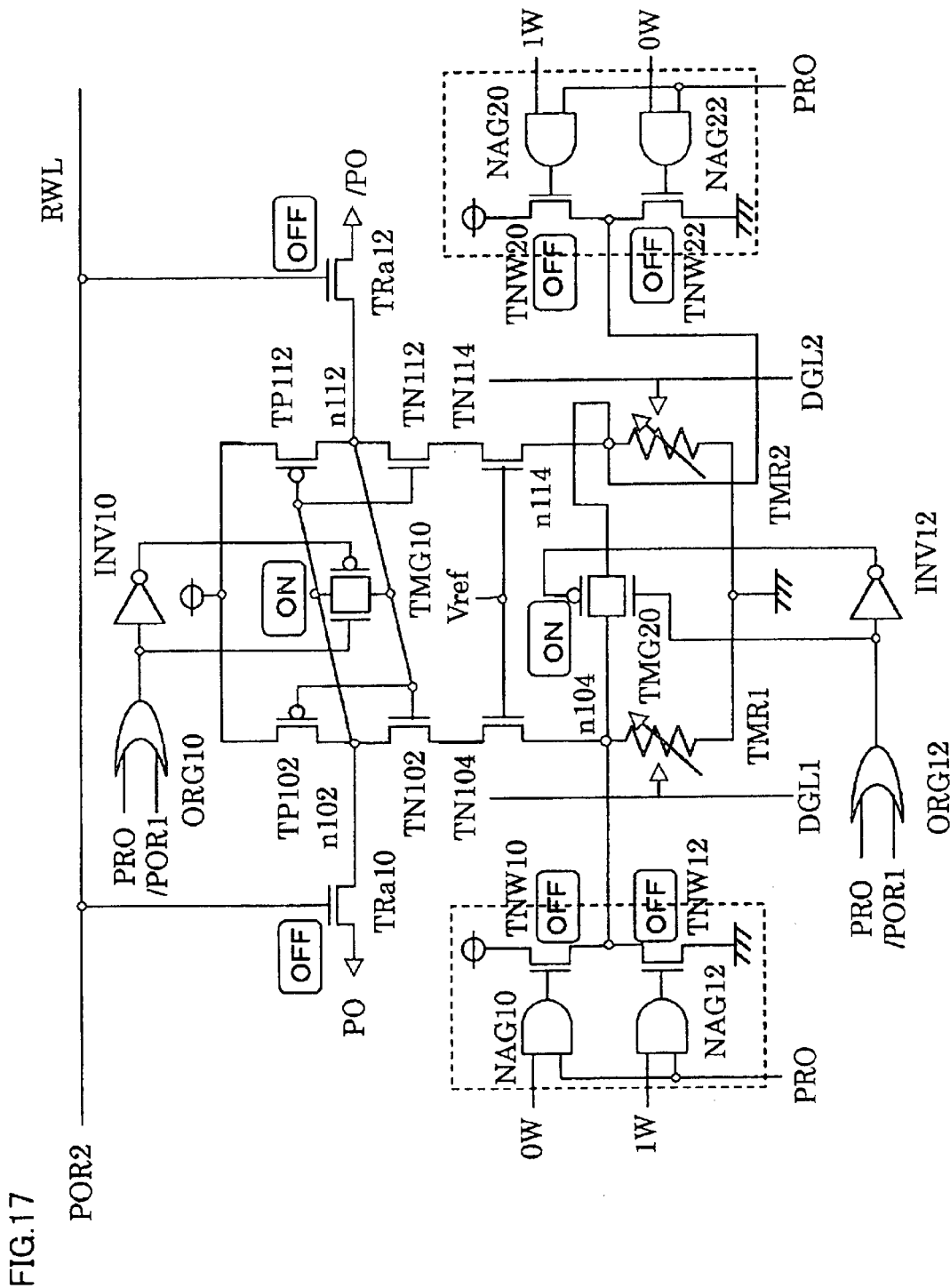

At a time t1, semiconductor integrated circuit device 1000 is powered on so that externally applied external power supply potential ext.Vcc starts to rise to a predetermined voltage. In response to this, control portion 20 issues first power-on reset signal POR1 at a time t2. For a period between times t1 and t2, therefore, both transmission gates TMG10 and TMG20 are on, as already described with reference to FIG. 17.

At time t2, signal POR1 rises, and transmission gates TMG10 and TMG20 are turned off in response to this rising as shown in FIG. 18. Therefore, the latch circuit formed of transistors TP102, TN104, TP112 and TN114 starts the operation.

If TMR element TMR2 is preprogrammed to have a higher resistance value as already described, node n102 is discharged to "L" level to a higher extent because the TMR element connected to the source side of transistor TN102 has a lower resistance value. Therefore, node n102 changes to "L" level, and node n112 changes to "H" level.

Thereafter, second power-on reset signal POR2 rises at a time t3 delayed by a time corresponding to a sense time from time t2 when a predetermined time elapses from time t1. Thereby, as shown in FIG. 19, both access transistors TRa10 and TRa12 are turned on to output data, which is externally held.

Owing to the above structures, it is possible to program nonvolatilely the tuning data for the internal power supply generating circuit by using the magneto-resistance elements.

[Fourth Element]

According to programming element PGE of the third embodiment shown in FIG. 15, the data is nonvolatilely held by the preprogramming, which is performed by externally applied magnetic fields so that two TMR elements TMR1 and TMR2 may have different resistance values, respectively.

However, according to the structure using program portion 46 shown in FIG. 2, it is necessary to write only once the data to be programmed, and such a structure is not essential that a magnetic field is externally applied to change the resistance value of the TMR element.

More specifically, if transistors TN104 and TN114 shown in FIG. 15 are eliminated, this breaks a tunneling barrier TB in one of TMR elements TMR1 and TMR2, and particularly in the TMR element subjected to a higher voltage for the programming. If such breakage occurs, the TMR element has a sufficiently small resistance value. By utilizing the above features, data may be recorded nonvolatilely. This structure can be employed more advantageously if any one of internal circuits 100.1–100.4 integrated on semiconductor integrated circuit device 1000 is provided with a MRAM, because the elements in the above structure can be formed by the same process.

Figure 21:
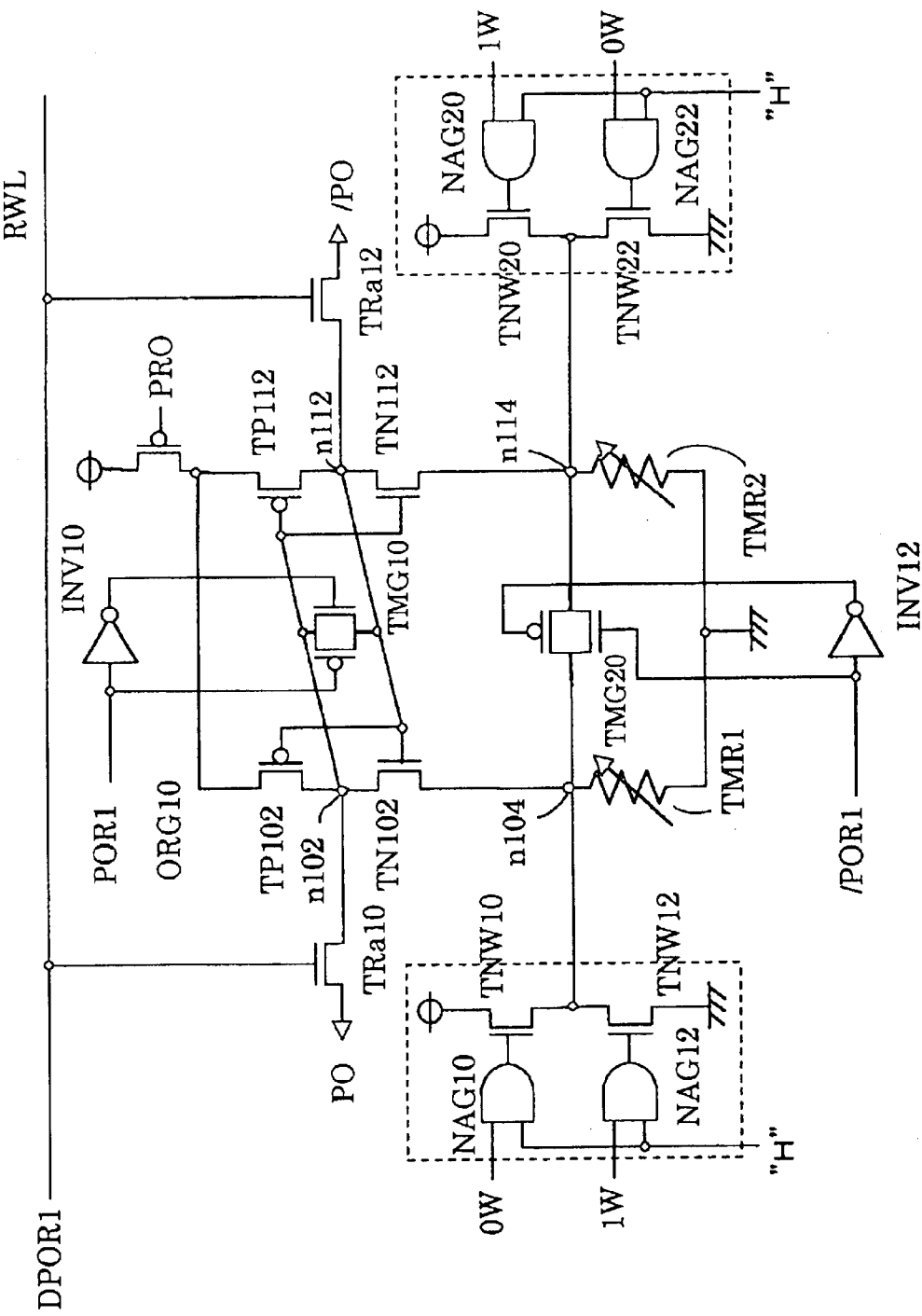
FIG. 21 is a circuit diagram showing a structure of a programming element PGE'.

FIG. 21 is a circuit diagram showing a structure of a programming element PGE' for performing the above operation.

The structure in FIG. 21 differs from the structure of programming element PGE shown in FIG. 15 as follows.

Programming element PGE' is not provided with OR circuit ORG10 for controlling on/off of transmission gate TMG10, and is configured to apply signal POR1 directly to inverter INV10.

In accordance with this, transmission gate TMG10 is arranged so that it is on when signal POR1 is at "L" level, and is turned off when signal POR1 attains "H" level.

Further, programming element PGE' is not provided with OR circuit ORG12 for controlling on/off of transmission gate TMG20, and is configured to apply signal /POR1 directly to inverter INV12. Therefore, transmission gate TMG20 is on when signal /POR1 is at "H" level (i.e., when signal POR1 is at "L" level), and is off when signal /POR1 is at "L" level.

Since it is not necessary to change the resistance values of TMR elements TMR1 and TMR2 by externally applying the magnetic field, both digit lines DGL1 and DGL2 are not employed.

Further, it is not necessary to arrange the interconnections between nodes n104 and n114 for providing the currents in the opposite directions, in contrast to the interconnection arrangement in FIG. 15.

Structures other than the above are substantially the same as those of programming element PGE shown in FIG. 15. The same portions bear the same reference numbers, and description thereof is not repeated.

Figure 22:
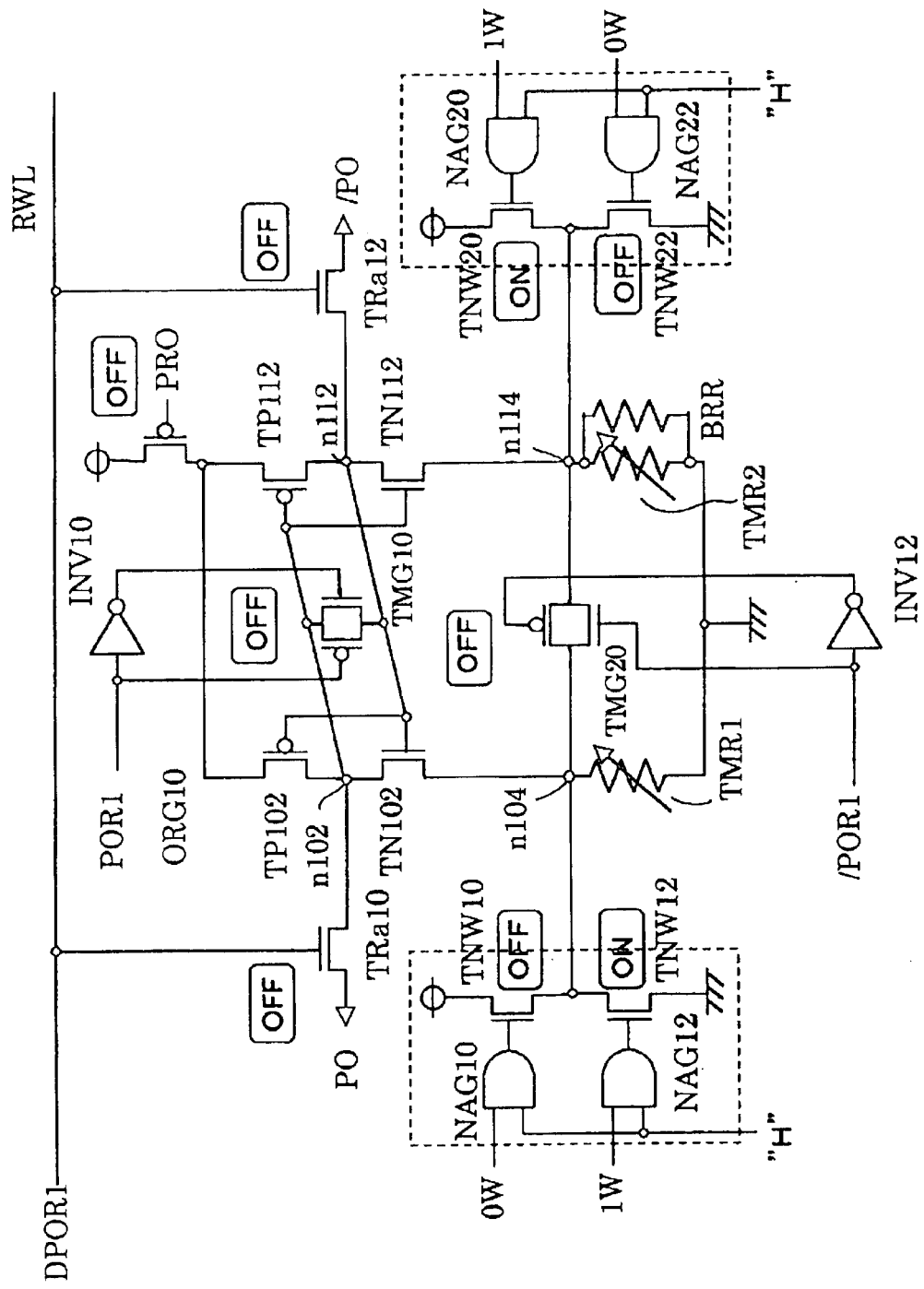
FIG. 22 conceptually shows states of various elements during programming of programming element PGE' shown in FIG. 21.

FIG. 22 conceptually shows states of various elements during programming of programming element PGE' shown in FIG. 21.

Particularly, FIG. 22 shows an operation for storing "H" level on node n102.

Levels of signals 0W and 1W are set such that transistor TNW10 is off, transistor TNW12 is on, transistor TNW20 is on and transistor TNW22 is off.

Therefore, the power supply potential is applied to TMR element TMR2 to cause insulation breakdown in tunneling barrier TB thereof so that the resistance value of TMR element TMR2 decreases. This state is depicted in FIG. 22 by adding a resistance BRR of a smaller resistance value in parallel to TMR element TMR2.

Figure 23:
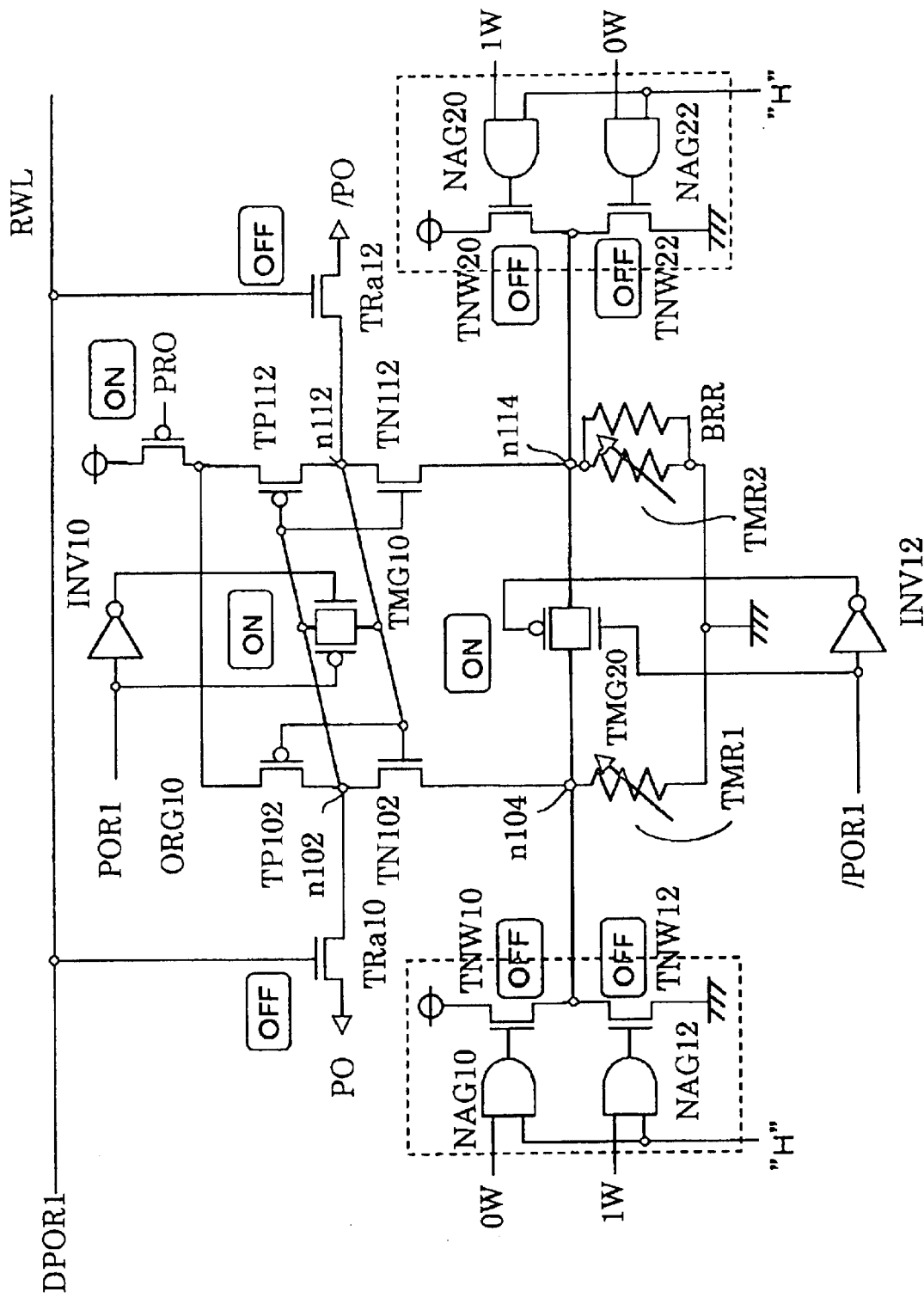

FIG. 23 conceptually shows a state of programming element PGE' shown in FIG. 21 immediately after the power-on.

In this case, signal POR1 is at "L" level, and signal/POR1 is at "H" level. Therefore, both transmission gates TMG10 and TMG20 are on.

Figure 24:
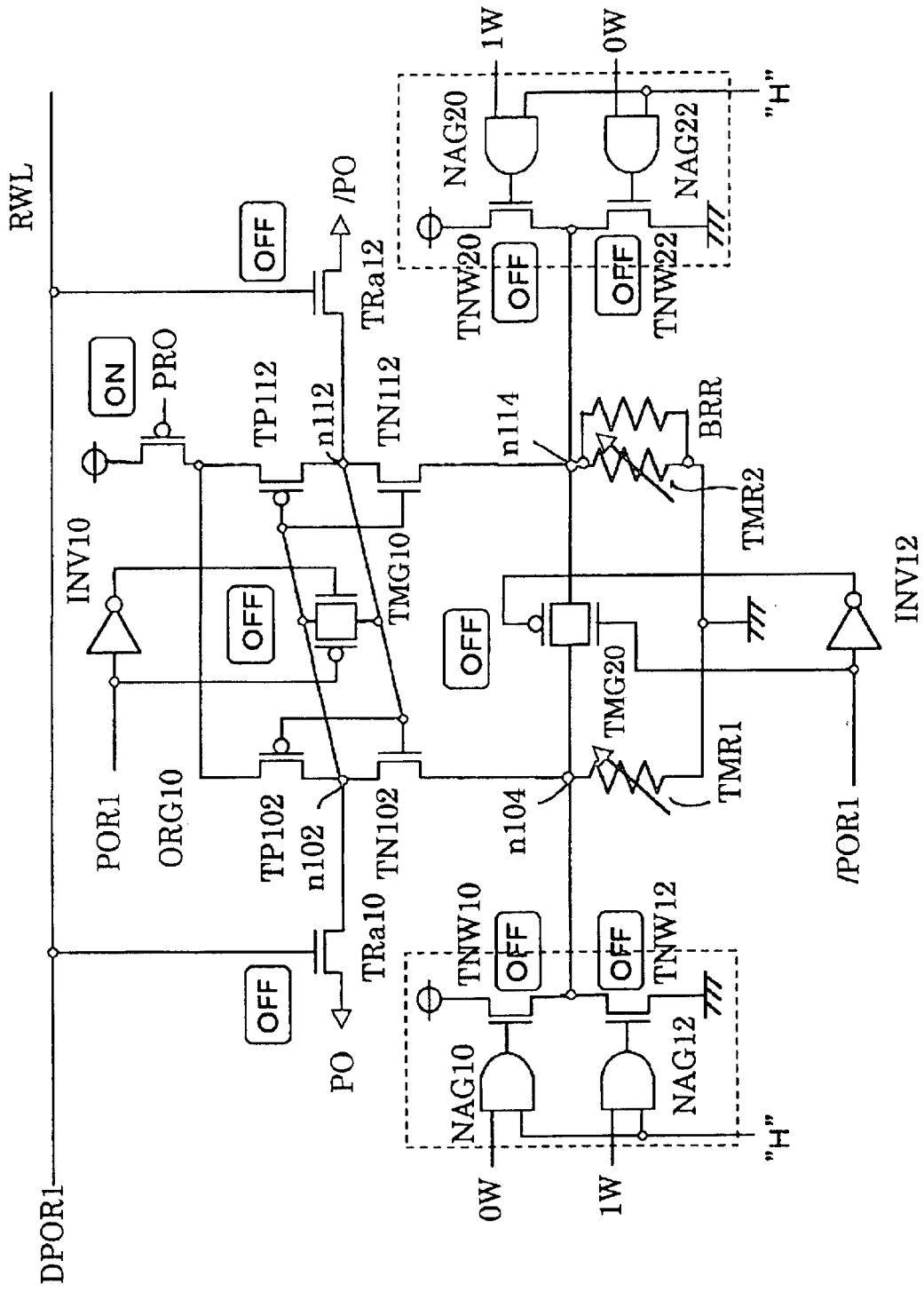

FIG. 24 shows a state after power-on of program element PGE' shown in FIG. 21, and particularly a state, in which power-on reset signal POR1 attains "H" level in response to the power on. In this state, both transmission gates TMG10 and TMG20 are off. Therefore, the latch circuit formed of transistors TP102, TN102, TP112 and TN112 starts the latch circuit operation.

Since the resistance is smaller on the side of TMR element TMR2 as already described, node n 112 is discharged to "L" level to a higher extent. Therefore, the circuit enters the stable state when node n 112 attains "L" level. Accordingly, node n102 attains "H" level, which corresponds to the written state in the programmed circuit.

Figure 25:
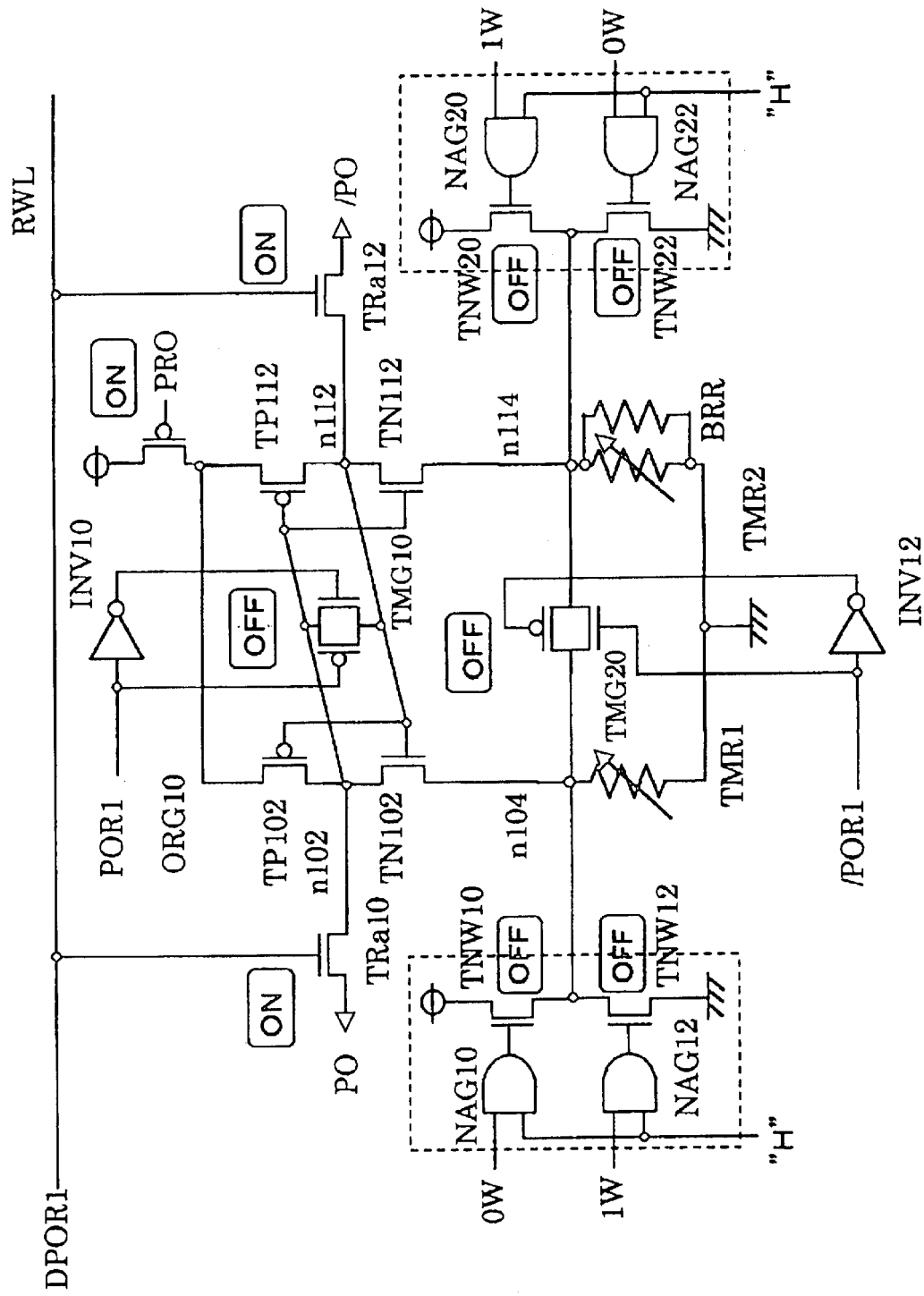
FIG. 25 conceptually shows a state, in which data reading is performed in programming element PGE' shown in FIG. 21.

FIG. 25 conceptually shows a state for data reading in programming element PGE' shown in FIG. 21.

In this case, read word line RWL is supplied with a delayed power-on reset signal DPOR1 delayed by a predetermined time from power-on reset signal POR1. Therefore, both access transistors TRa10 and TRa12 are on. In response to this, the levels of nodes n102 and n112 are externally read out as data P0 and /P0.

Figure 26:
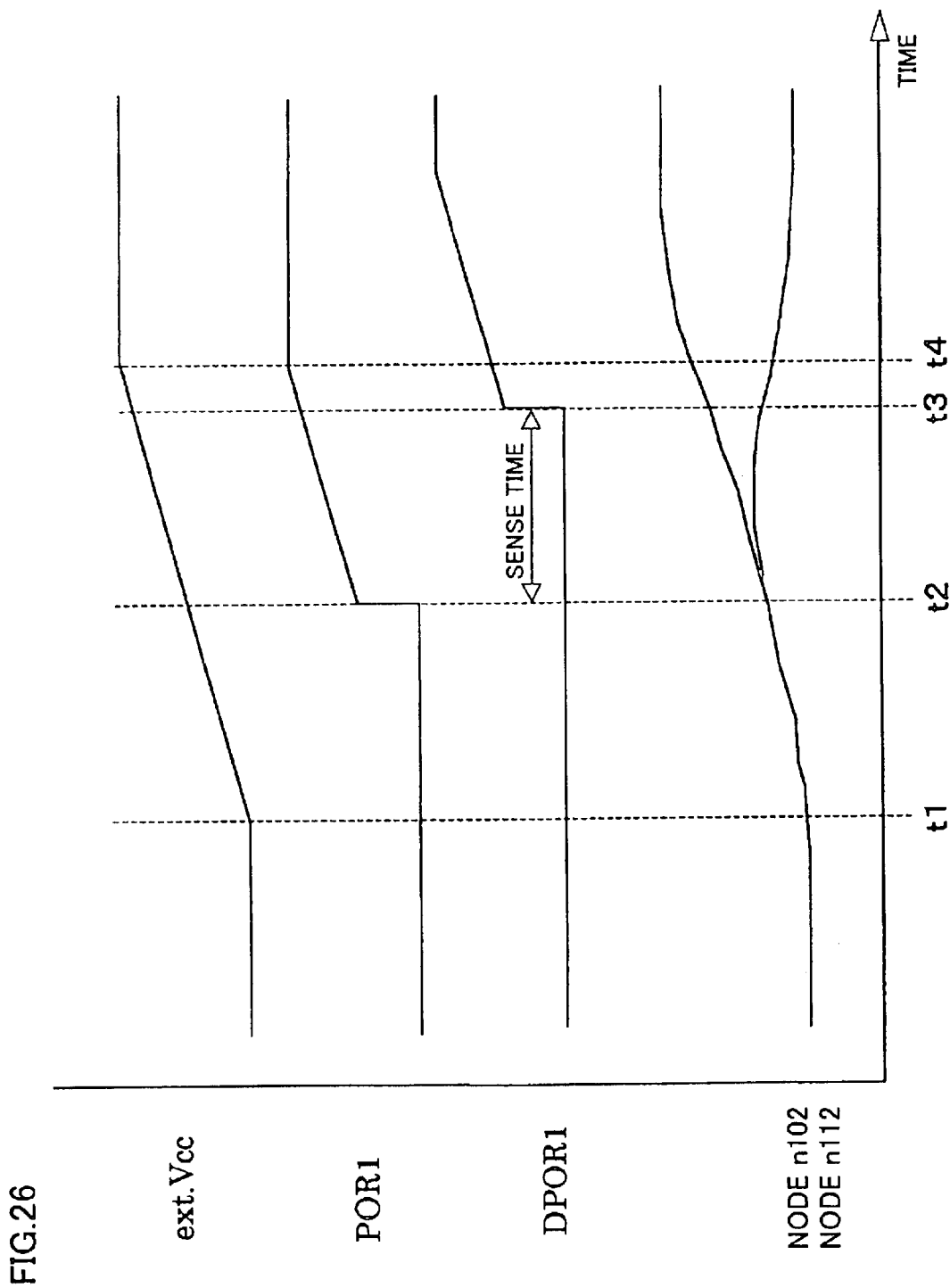
FIG. 26 is a timing chart showing reading of programming element PGE' shown in FIGS. 22–25.

FIG. 26 is a timing chart representing reading in programming element PGE' already described with reference to FIGS. 22–25.

Similarly to FIG. 20, an external power is turned on at time t1 so that the power supply potential starts to rise toward a predetermined level. At this point in time, both transmission gates TMG10 and TMG12 are on as shown in FIG. 23.

At time t2, power-on reset signal POR1 starts to rise. Thereby, both transmission gates TMG10 and TMG12 are turned off as shown in FIG. 24. In response to this, the sense operation is performed in accordance with the resistance values of transmission gates TMG10 and TMG12.

At time t3, control circuit 20 outputs delayed power-on reset signal DPOR1 delayed from power-on reset signal POR1 by a predetermined time. In response to this, read word line RWL attains "H" level, and access transistors TRa10 and TRa12 are turned on. Thereby, data stored in programming element PGE' is read.

The structure described above can achieve effects similar to those of the third embodiment.

[Fifth Embodiment]

Description has been given on a structure, in which transmission gates TMG10 and TMG12 using magnetic tunnel junctions are used for nonvolatilely storing program data in program portion 46 shown in FIG. 2.

However, if internal circuit 100.1 is formed of a memory circuit, the tunneling magneto-resistance elements can be used for programming faulty addresses to be replaced by redundant replacement.

The fifth embodiment will be described in connection with the above structure.

Figure 27:
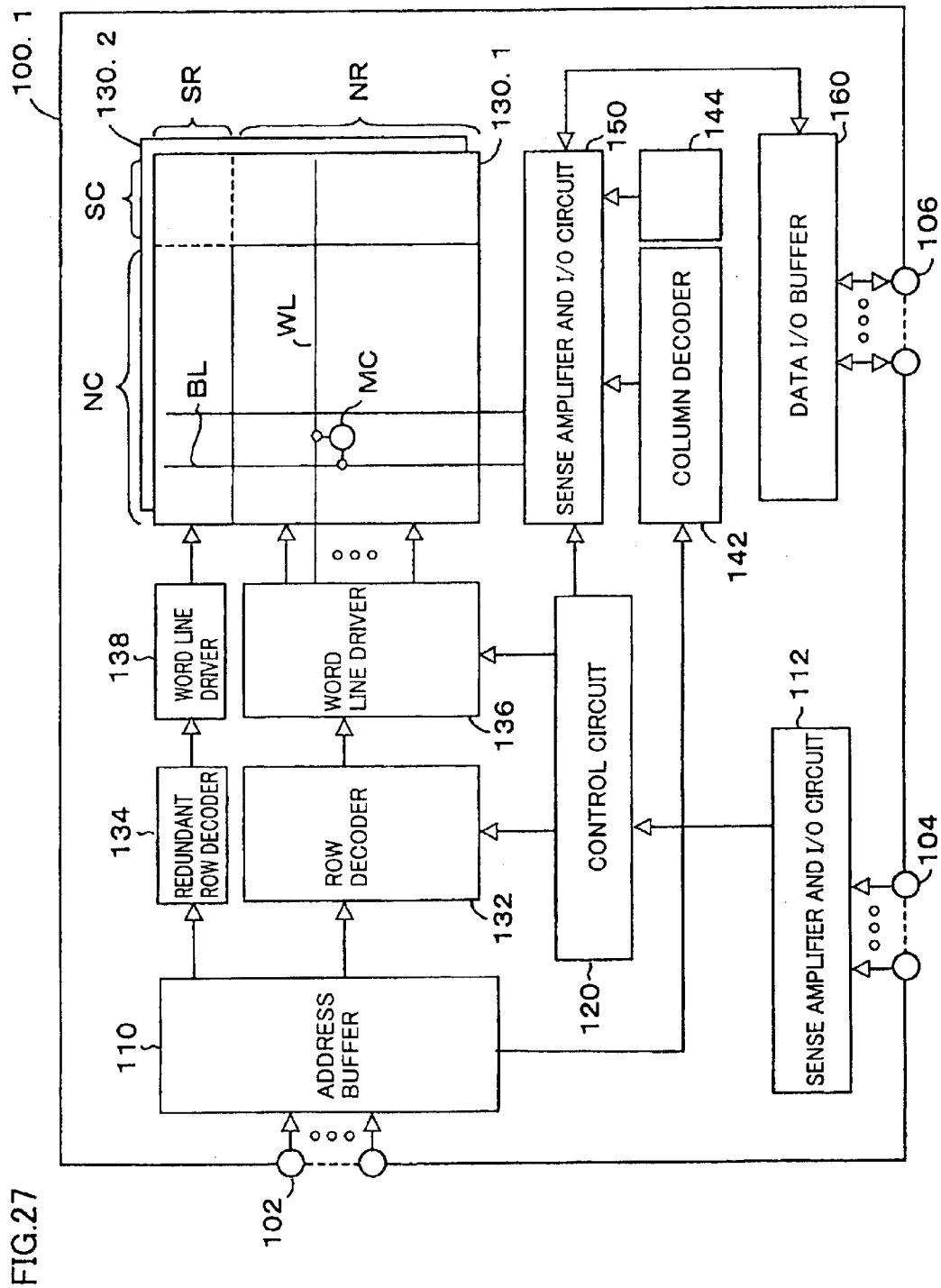
FIG. 27 is a schematic block diagram showing a structure of a memory circuit 100.1.

FIG. 27 is a schematic block diagram showing a structure of such memory circuit 100.1.

The structure, in which the magneto-resistance elements are used for storing faulty addresses to be replaced by redundant replacement, can be applied not only to the case, where the memory circuit and the logic circuit are integrated on one chip as shown in FIG. 1, but also to the case, where only the memory circuit is integrated on one chip.

In the memory circuit, the memory cells for storing data to be transmitted externally may be memory cells in a conventional dynamic random access memory, and also may be memory cells of a static random access memory. However, if the circuit employs the MRAM, in which memory cells use tunneling magneto-resistance elements, the program element can be formed in the same step. This is more advantageous for integration.

Referring to FIG. 27, memory circuit 100.1 includes an address signal input node group 102 for receiving externally supplied address signals, a control signal input node group 104 for receiving externally supplied control signals and a data I/O node group 106 for externally transmitting data.

Memory circuit 100.1 further includes an address buffer 110, which receives the address signals from address signal input node group 102 for converting them to mutually complementary internal address signals, a control signal input buffer 112 for receiving the signals from control signal input node group 104, a control circuit 120, which receives the signals from control signal input buffer 112 to output control signals for controlling internal operations of memory circuit 100.1, and a memory cell array 130.1 including a plurality of memory cells MC arranged in rows and columns.

In memory cell array 130.1, memory cell rows can be divided into a normal memory cell row region NR including normal memory cell rows and a spare memory cell row region SR including redundant memory cell rows. In memory cell array 130.1, memory cell columns can be divided into a normal memory cell column region NC including normal memory cell columns and a spare memory cell column region SC including redundant memory cell columns.

Word lines WL are provided corresponding to the rows in memory cell array 130.1, respectively, and bit lines BL are arranged corresponding to the memory cell columns in memory cell array 130.1, respectively. Memory cell MC is arranged at each of crossings between bit lines BL and word lines WL. In FIG. 27, only one memory cell MC is depicted.

Memory circuit 100.1 further includes a plurality of memory cell arrays each having a structure similar to that of memory cell array 130.1. It is assumed that each memory cell array operates as a so-called "bank". FIG. 27 shows an example, which additionally includes a memory cell array 130.2. The banks are selected in accordance with the address signal.

Memory circuit 100.1 further includes a row decoder 132, which is controlled by control circuit 120 to produce a signal for selecting a corresponding memory cell row (word line WL) in accordance with the internal address signal sent from address buffer 110, a redundant row decoder 134, which selects a redundant row and inhibits the selection of the normal memory cell row in accordance with results of a comparison between the internal address signal sent from address buffer 110 and prestored faulty row addresses, a word line driver 136 for driving the potential level of the corresponding word line in accordance with the row select signal sent from row decoder 132, and a word line driver 138 for driving the word line in the corresponding redundant row in accordance with a signal sent from redundant row decoder 134.

Memory circuit 100.1 further includes a column decoder 142 for selecting a normal memory cell column in memory cell array 130.1 in accordance with the internal column address signal sent from address buffer 110, a redundant column decoder 144, which selects the redundant memory cell column, and inhibits the selection of the normal memory cell column in accordance with the internal column address sent from address buffer 110, a sense amplifier and I/O circuit 150, which selects a memory cell column (bit line BL) for reading or writing data in accordance with a column select signal YS sent from column decoder 142 or redundant column decoder 144, and a data I/O buffer 160, which receives read data from sense amplifier and I/O circuit 150 for applying it to data I/O node group 106, or receives data from data I/O node group 106 for applying it to sense amplifier and I/O circuit 150.

Figure 28:
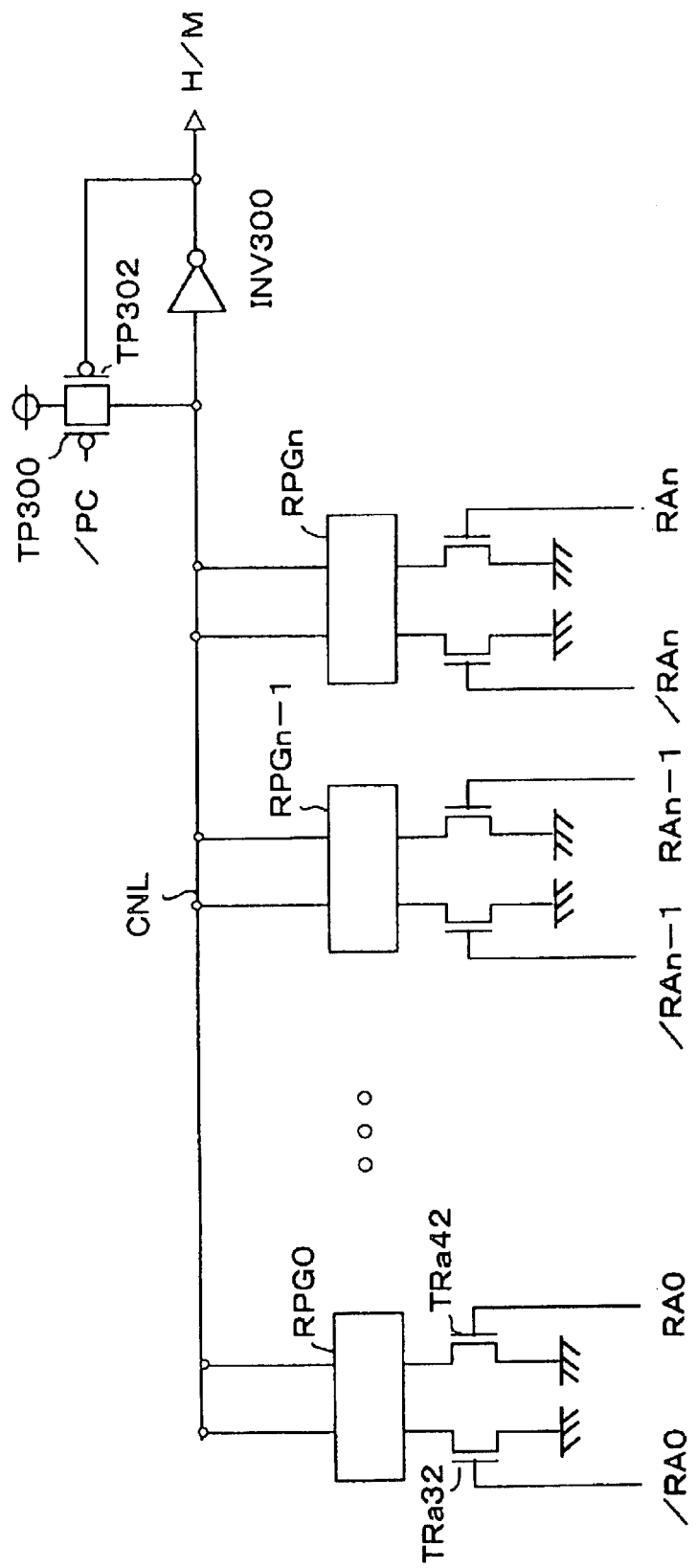
FIG. 28 is a schematic block diagram particularly showing a comparing circuit 135 for making a comparison between a preprogrammed faulty row address and an applied internal input row address.

FIG. 28 is a schematic block diagram fragmentarily showing the redundant row decoder shown in FIG. 27, and particularly showing a comparing circuit 135 for making a comparison between the preprogrammed faulty row address and the applied internal row address.

In accordance with the input address signals, address buffer 110 supplies to comparing circuit 135 internal row address signals RA0–RAn as well as signals /RA0–/RAn at levels complementary to those of internal row address signals RA0–RAn.

For example, a programming circuit PRG0 is provided corresponding to internal row address signals RA0 and /RA0. A transistor TRa32 is arranged between programming circuit PRG0 and ground potential Vss, and receives signal /RA0 on its gate. A transistor TRa42 is arranged between programming circuit PRG0 and ground potential Vss, and receives internal row address signal RA0 on its gate.

For other internal row address signals RAi and /RAi (i=2–n), there are arranged programming circuits RPGi as well as transistors TRa32 and TRa42.

As will be described later, programming circuit PRG0 discharges a common node CNL when prestored data does not match with internal row address signals RA0 and /RA0. This is true also with respect to other programming circuits PRGi.

Comparing circuit 135 further includes a P-channel MOS transistor TP300 for precharging node CNL to "H" level in accordance with a precharge signal /PC, an inverter INV300 for receiving on its input the level of node CNL, and a P-channel MOS transistor TP302, which is connected in parallel with transistor TP300, and receives the output of inverter INV300 on its gate.

The output of inverter INV300 is issued as a signal H/M representing whether the prestored faulty address matches with internal address signals RA0 and /RA0–RAn and /RAn.

Figure 29:
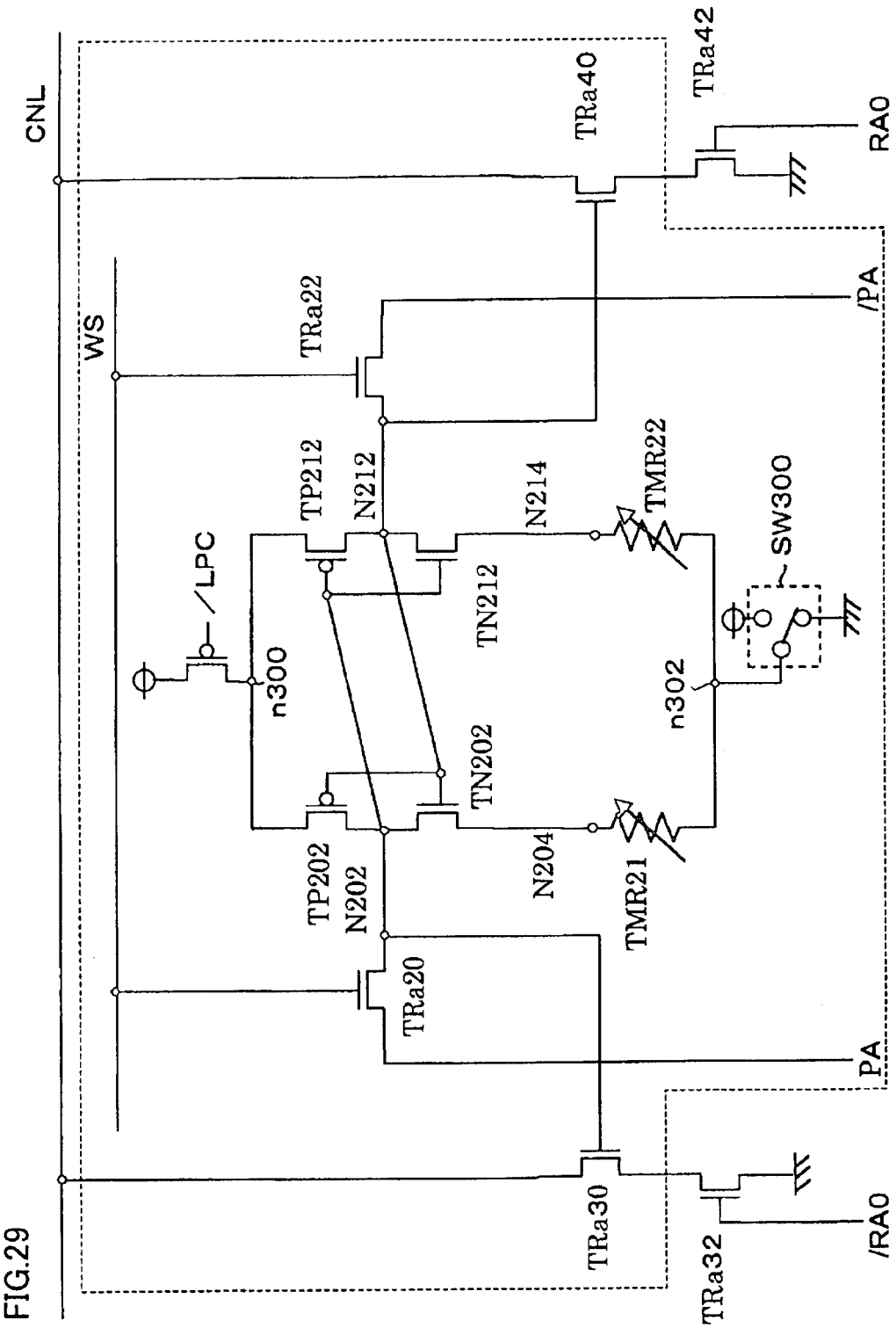
FIG. 29 is a circuit diagram showing a structure of a programming circuit PRG0 shown in FIG. 28.

FIG. 29 is a circuit diagram showing a structure of programming circuit PRG0 shown in FIG. 28.

Other programming circuits have substantially the same basic structures.

Programming circuit PRG0 includes a P-channel MOS transistor TP310, which is arranged between internal node n300 and the power supply potential for driving node n300 to "H" level in accordance with latch precharge signal /LPC, and also includes a P-channel MOS transistor TP202, an N-channel MOS transistor TN202 and a TMR element TMR21, which are connected in series between node n300 and an internal node n302, as well as a P-channel MOS transistor TP212, an N-channel MOS transistor TN212 and a TMR element TMR22, which are connected in series between nodes n300 and n302. Node n302 is selectively coupled through a switching circuit SW300 to ground potential Vss and the power supply potential.

A connection node between transistors TP202 and TN202 is referred to as a node N202, and a connection node between transistor TN202 and TMR element TMR21 is referred to as a node N204. Likewise, a connection node between transistors TP212 and TN212 is referred to as a N212, and a connection node between transistor TN212 and TMR element TMR22 is referred to as a node N214.

Gates of transistors TP202 and TN202 are connected together, and the gate of transistor TN202 is coupled to node N212.

Gates of transistors TP212 and TN212 are connected together, and the gate of transistor TN212 is coupled to node N202.

Node N202 receives a programming signal PA via an access transistor TRa20, which is turned on in accordance with a write control signal WS. Node N212 receives a programming signal /PA via an access transistor TRa22, which is turned on in accordance with write control signal WS.

Programming circuit PRG0 further includes an N-channel MOS transistor TRa30, which is arranged between common node CNL and a transistor TRa32, and has a gate coupled to node N202, and a transistor TRa40, which is arranged between common node CNL and a transistor TRa42, and has a gate coupled to node N212.

In the programming operation for programming a faulty address, switch circuit SW30 is in the position supplying the power supply potential to node n302. In this state, when signal WS attains "H" level to turn on both transistors TRa20 and TRa22, transistor TN212 is turned on to apply a high voltage to TMR element TMR22 if signals PA and /PA are, for example, at "H" and "L" levels, respectively.

Therefore, insulation breakdown occurs in tunneling barrier TB of TMR element TMR 22, and the resistance value of TMR element TMR 22 decreases.

In the operation of comparing the stored faulty address with the internal row address, switch circuit SW30 is in the position for supplying the ground potential to node n302. In this state, when latch precharge signal /LPC attains "L" level, node N212 is coupled to the ground potential via TMR element TMR22 having a smaller resistance value so that node N212 attains "L" level, and node N202 attains "H" level. Thereby, the circuit state becomes stable.

When the programming operation described above is performed and signal /LPC attains "L" level, transistor TRa30 is on, and transistor TRa40 is off.

When signals /RA0 and RA0 are at "H" and "L" levels, respectively, common node CNL is discharged to attain "L" level.

Conversely, when signals /RA0 and RA0 are at "L" and "H" levels, respectively, node CNL maintains the state precharged at "H" level in accordance with precharge signal /PC. Therefore, signal H/M attains "L" level if the prestored faulty address matches with applied internal row address signals RA0 and /RA0–RAn and /RAn. If not, signal H/M attains "H" level.

Figure 30:
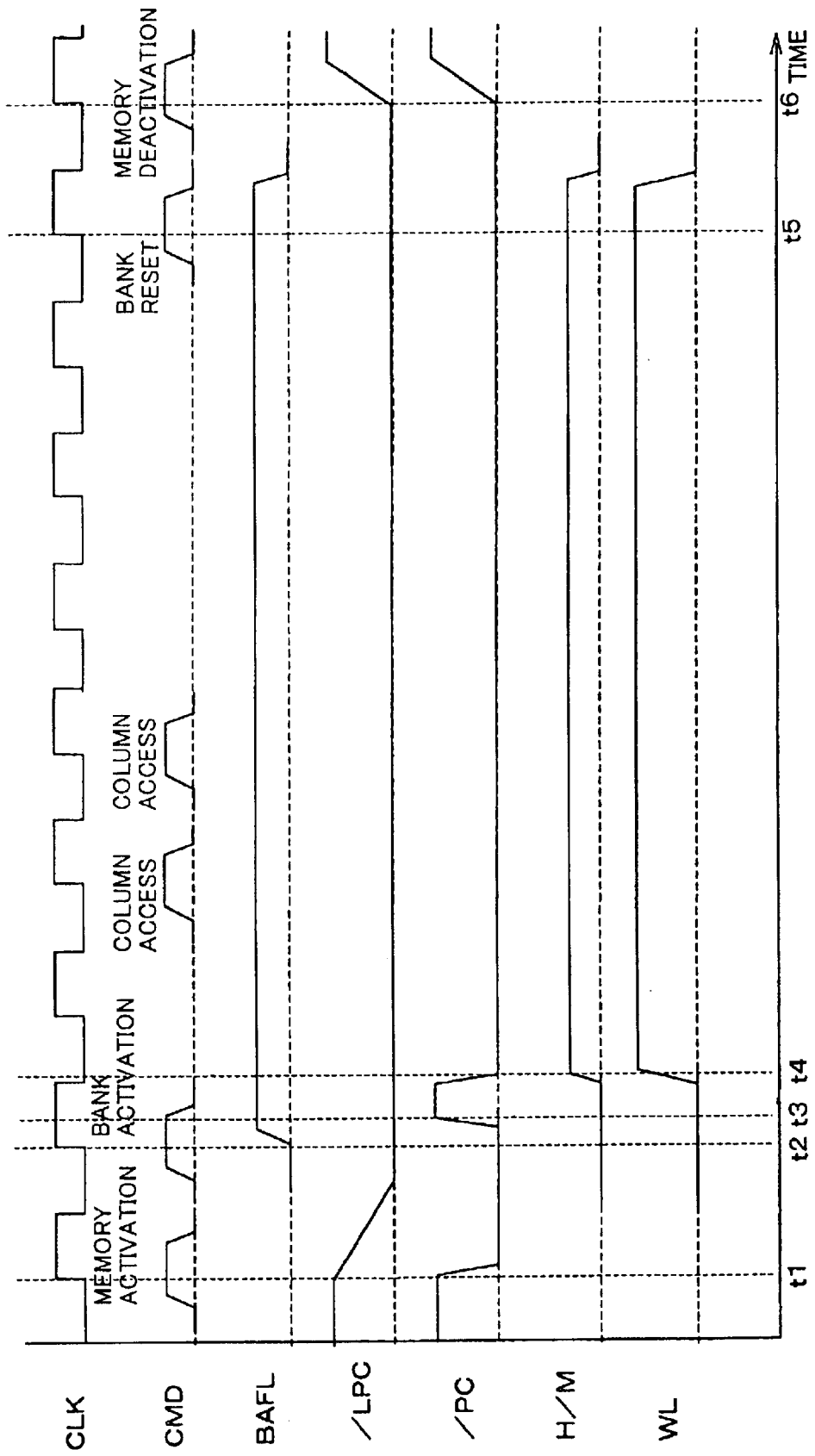
FIG. 30 is a timing chart representing an operation of comparing circuit 135 shown in FIG. 28.

FIG. 30 is a timing chart showing an operation of comparing circuit 135 shown in FIG. 28.

FIG. 30 shows an operation, in which the programming circuit has stored the row addresses, and thereby the programmed faulty row address is compared with the internal row address signal.

In this case, activation of the memory is instructed in accordance with the control signal at time t1, and it is assumed that both signals /LPC and /PC attain "L" level in accordance with this instruction. When activation of a bank is instructed at time t2, a bank activation flag BAFL attains "H" level in the selected bank. It is assumed that signal /PC attains "H" level in accordance with this bank activation, and thereby the programmed faulty address is compared with the internal row address. In accordance with results of this comparison, the level of signal H/M is determined, and the corresponding word line is selected.

The above operation is performed for preventing increase in current consumption of the programming circuit due to the leak current during the active state. For this purpose, such a structure is employed that activation of row-related programming circuits PRG0–PRGn in the row-related operation is performed not after the power-on but after the memory activation, and in other words, setting of signal /LPC to "L" level and precharging of common node CNL are performed not after the power-on but after the memory activation.

Figure 31:
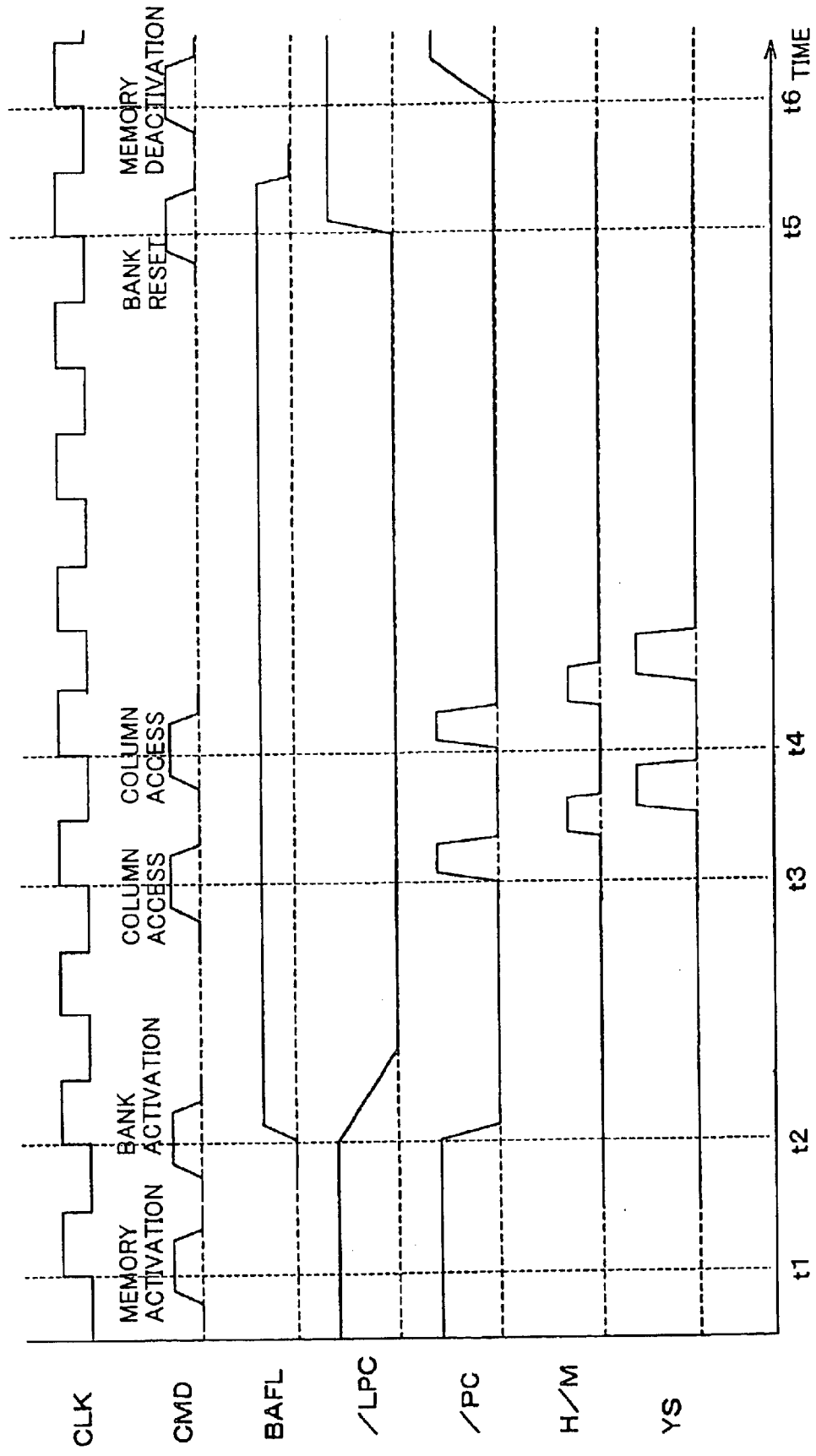
FIG. 31 is a second timing chart representing an operation of comparing circuit 135 shown in FIG. 28.

FIG. 31 is a second timing chart representing an operation of comparing circuit 135 shown in FIG. 28.

FIG. 31 represents an operation, in which the programming circuit has stored column addresses, and thereby the programmed faulty column address is compared with the internal column address signal.

At time t1, activation of the memory is instructed in accordance with the control signal, and activation of the bank is instructed at time t2. It is assumed that both signals /LPC and /PC change toward "L" level in response to the above activation. It is also assumed that when the column access is instructed at times t3 and t4, signal /PC attains "H" level, and the programmed faulty address is compared with the internal column address in the selected bank. In accordance with results of this comparison, the level of signal H/M is determined, and the corresponding bit line is selected.

The above operation is performed for the purpose similar to that in the row-related operation, and particularly for preventing increase in current consumption of the programming circuit due to the leak current during the active state of the operation.

In FIG. 29, TMR elements TMR1 and TMR2 carrying complementary data may be arranged on the source sides of transistors TP202 and TP212, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   at least one internal circuit for performing predetermined processing based on at least data applied externally with respect to said semiconductor integrated circuit device or data transmitted mutually; p1 an internal potential generating circuit provided corresponding to said internal circuit for receiving a level set signal including information representing a level of an internal potential, and producing an internal potential at a level corresponding to said level set signal, said internal potential generating circuit including a comparing circuit for comparing a comparison reference potential with a level corresponding to said level set signal in a test operation;

a test control circuit for controlling test processing of a level of an output potential of said internal potential generating circuit, and operating in said test operation to apply successively the plurality of level set signals to said internal potential generating circuit;

a measuring circuit performing measurement in said test operation for detecting a set value required in said level set signal based on results of the comparison by said comparing circuit between the levels corresponding to said plurality of level set signals and said comparison reference potential; and a transmitting circuit for transmitting results of the measurement of said measuring circuit to said test control circuit.

2. The semiconductor integrated circuit device according to claim 1, wherein said comparing circuit compares said internal potential generated by said internal potential generating circuit with the level corresponding to said level set signal in the normal operation, and said internal potential generating circuit further includes a potential control circuit for tuning the level of said internal potential corresponding to an output of said comparing circuit.

3. The semiconductor integrated circuit device according to claim 2, wherein said internal potential generating circuit further includes a first switching circuit for receiving said internal potential generated by said internal potential generating circuit and said comparison reference potential, and selectively applying the received internal potential and the received comparison reference potential to said comparing circuit in accordance with an operation mode.

4. The semiconductor integrated circuit device according to claim 2, wherein said internal potential generating circuit further includes a reference potential generating circuit for receiving said level set signal, convening the level of the potential in accordance with said level set signal, and applying the potential at the converted level to said comparing circuit.

5. The semiconductor integrated circuit device according to claim 4, wherein said internal potential generating circuit further includes a second switching circuit for successively applying sad plurality of level set signals applied from said test control circuit to said reference potential generating circuit in said test operation, and applying a predetermined level set signal to said reference potential generating circuit in said normal operation.

6. The semiconductor integrated circuit device according to claim 5, further comprising:

a program circuit for holding said level set signal to be applied to said reference potential generating circuit in said normal operation.

7. The semiconductor integrated circuit device according to claim 1, wherein said measuring circuit includes a storage circuit for holding information representing said results of the measurement, wherein said transmitting circuit transmits said results of the measurement stored in said storage circuit to said test control circuit.

8. The semiconductor integrated circuit device according to claim 1, wherein said internal circuit is a memory circuit;

said memory circuit includes:

a regular memory cell array, a redundant memory cell array, a program circuit for prestoring a faulty address in said regular memory array, and a memory cell select circuit for selecting a memory cell in either said regular memory cell array or said redundant memory cell array in accordance with the results of the comparison between said faulty address stored in said program circuit and an address signal applied externally with respect to said internal circuit; and said program circuit includes:

a latch circuit for receiving a power supply potential via first and second power supply nodes, and being activated in response to power-on, and first and second tunneling magneto-resistance elements arranged between said first and second power supply nodes, respectively.

9. The semiconductor integrated circuit device according to claim 8, wherein said program circuit includes disabling means for disabling said latch circuit for a predetermined period after the power-on.

10. A semiconductor integrated circuit device comprising:

a program circuit for holding information relating to said semiconductor integrated circuit device, said program circuit including a latch circuit for receiving a power supply potential via first and second power supply nodes, said latch circuit being activated in response to power-on of said latch circuit, first and second tunneling magneto-resistance elements arranged between said first and second power supply nodes, respectively, and disabling means for disabling said latch circuit for a predetermined period after power-on.

11. A semiconductor integrated circuit device comprising:

a program circuit for holding information relating to said semiconductor integrated circuit device, said program circuit including a latch circuit for receiving a power supply potential via first and second power supply nodes, said latch circuit being activated in response to power-on of said latch circuit, and first and second tunnelintt magneto-resistance elements arranged between said first and second power supply nodes, respectively, wherein said program circuit stores data by applying a voltage higher than that in the normal operation to said tunneling magneto-resistance element and thereby breaking said tunneling magneto-resistance element.

12. A semiconductor integrated circuit device comprising:

at least one internal circuit for performing predetermined processing based on at least data applied externally with respect to said semiconductor integrated circuit device or data transmitted mutually;

an internal potential generating circuit provided corresponding to said internal circuit for receiving a level set signal including information representing a level of an internal potential, and producing an internal potential at a level corresponding to said level set signal;

said internal potential generating circuit including:

a comparing circuit operating in a normal operation to compare said internal potential generated by said internal potential generating circuit with the level corresponding to said level set signal, and operating in a test operation to stop the comparison between the level corresponding to said level set signal and said internal potential, and to compare a comparison reference potential with the level corresponding to said level set signal, and a potential control circuit for tuning the level of said internal potential in accordance with an output of said comparing circuit;

a test control circuit for controlling test processing of a level of the output potential of said internal potential generating circuit, and operating in said test operation to apply successively the plurality of level set signals to said internal potential generating circuit for successively generating the plurality of internal potentials at different levels, respectively;

a measuring circuit performing measurement in said test operation for detecting a set value required in said level set signal based on results of the comparison by said comparing circuit between the respective internal potentials generated by said internal potential generating circuit and said comparison reference potential; and a transmitting circuit for transmitting results of the measurement of said measuring circuit to said test control circuit.

13. The semiconductor integrated circuit device according to claim 12, wherein said internal potential generating circuit further includes a first switching circuit for receiving said internal potential generated by said internal potential generating circuit and said comparison reference potential, and selectively applying the received internal potential and the received comparison reference potential to said comparing circuit in accordance with an operation mode.

14. The semiconductor integrated circuit device according to claim 12, wherein said internal potential generating circuit further includes a reference potential generating circuit for receiving said level set signal, converting said level set signal to a level corresponding to said level set signal, and applying the converted signal to said comparing circuit.

15. The semiconductor integrated circuit device according to claim 14, wherein said internal potential generating circuit further includes a second switching circuit for successively applying said plurality of level set signals applied from said test control circuit to said reference potential generating circuit in said test operation, and applying a predetermined level set signal to said reference potential generating circuit in said normal operation.

16. The semiconductor integrated circuit device according to claim 12, wherein said internal potential is higher than an external power supply potential, and said internal potential generating circuit includes a booster circuit for boosting said external power supply potential.

17. The semiconductor integrated circuit device according to claim 16, wherein said internal potential generating circuit further includes:

a voltage dividing circuit for dividing an output of said booster circuit, and a first switching circuit for receiving an output of said voltage dividing circuit and said comparison reference potential, and selectively applying the received output and the received comparison reference potential to said comparing circuit in accordance with an operation mode.

18. The semiconductor integrated circuit device according to claim 12, wherein said internal potential is lower than a ground potential, and said internal potential generating circuit includes a negative potential producing circuit for receiving and lowering an external power supply potential and said ground potential to produce a negative potential.

19. The semiconductor integrated circuit device according to claim 18, wherein said internal potential generating circuit includes:

a reference potential generating circuit for receiving said level set signal, converting said level set signal to a level corresponding to said level set signal, and applying the converted signal to said comparing circuit, first shift means for shifting an output of said negative potential producing circuit by a predetermined amount in said test operation, and second shift means for shifting an output of said reference potential generating circuit by said predetermined amount in said test operation.

* * * * *